(12) United States Patent
Yano et al.

(10) Patent No.: US 10,817,110 B2
(45) Date of Patent: Oct. 27, 2020

(54) ELECTRONIC BOARD

(71) Applicant: SHARP KABUSHIKI KAISHA, Sakai, Osaka (JP)

(72) Inventors: Hisamitsu Yano, Sakai (JP); Ramadhan Ismail, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days.

(21) Appl. No.: 16/446,344

(22) Filed: Jun. 19, 2019

(65) Prior Publication Data

US 2020/0004399 A1    Jan. 2, 2020

(30) Foreign Application Priority Data

Jun. 28, 2018   (JP) ................. 2018-123336

(51) Int. Cl.

| | |
|---|---|
| G06F 3/041 | (2006.01) |
| H05K 1/14 | (2006.01) |
| H05K 1/02 | (2006.01) |
| G06F 3/044 | (2006.01) |
| G06F 3/0354 | (2013.01) |
| G06F 3/0488 | (2013.01) |
| B43K 1/12 | (2006.01) |
| B43K 1/01 | (2006.01) |
| H05K 3/46 | (2006.01) |

(52) U.S. Cl.
CPC ............ *G06F 3/04162* (2019.05); *B43K 1/01* (2013.01); *B43K 1/12* (2013.01); *G06F 3/03545* (2013.01); *G06F 3/0445* (2019.05); *G06F 3/0446* (2019.05); *G06F 3/04883* (2013.01); *H05K 1/0298* (2013.01); *H05K 1/144* (2013.01); *G06F 2203/04103* (2013.01); *H05K 3/4644* (2013.01); *H05K 2201/041* (2013.01); *H05K 2201/10151* (2013.01)

(58) Field of Classification Search
CPC ................................ G06F 3/041; G06F 3/045
See application file for complete search history.

(56) References Cited

U.S. PATENT DOCUMENTS

| | | | |
|---|---|---|---|
| 2015/0241906 A1* | 8/2015 | Tsai ................. | G06F 3/044 345/173 |
| 2017/0220178 A1* | 8/2017 | Jian ................. | G06F 3/0412 |
| 2018/0018062 A1* | 1/2018 | Takahashi .......... | G01B 21/04 |
| 2019/0369865 A1* | 12/2019 | Xia ................. | G06F 3/0442 |

FOREIGN PATENT DOCUMENTS

JP    2004-188736 A    7/2004

* cited by examiner

*Primary Examiner* — Pegeman Karimi
(74) *Attorney, Agent, or Firm* — ScienBiziP, P.C.

(57) ABSTRACT

An electronic board includes: a sensor sheet including X parallel electrode wires and Y parallel electrode wires, and a chassis to which the sensor sheet is attached. A sensor substrate is connected to a lower end of the sensor sheet. A sensor substrate is connected to a right end of the sensor sheet. The sensor substrate is disposed on a back surface of the chassis with a portion close to the lower end of the sensor sheet being bent to cover a lower end of the chassis.

4 Claims, 31 Drawing Sheets

FIG. 6A

| IDENTIFIER COMPONENT TYPE | fo (kHz) | WRITING COLOR |
|---|---|---|
| ID1 | 100 | BLACK |
| ID2 | 120 | BLUE |
| ID3 | 140 | GREEN |
| ID4 | 160 | YELLOW |
| ID5 | 180 | ORANGE |
| ID6 | 200 | RED |

FIG. 6B

| IDENTIFIER COMPONENT TYPE | fo (kHz) | WRITING COLOR | PEN TIP SIZE | PEN TIP SHAPE |
|---|---|---|---|---|
| ID-a | 100 | BLACK | FINE | ● |
| ID-b | 105 | BLACK | FINE | ■ |
| ID-c | 110 | BLACK | THICK | ● |
| ID-d | 115 | BLACK | THICK | ■ |
| ID-e | 120 | BLUE | FINE | ● |
| ID-f | 125 | BLUE | FINE | ■ |
| ID-g | 130 | BLUE | THICK | ● |
| ID-h | 135 | BLUE | THICK | ■ |
| ID-i | 140 | GREEN | FINE | ● |
| ⋮ | ⋮ | ⋮ | ⋮ | ⋮ |
| ID-u | 215 | RED | THICK | ● |

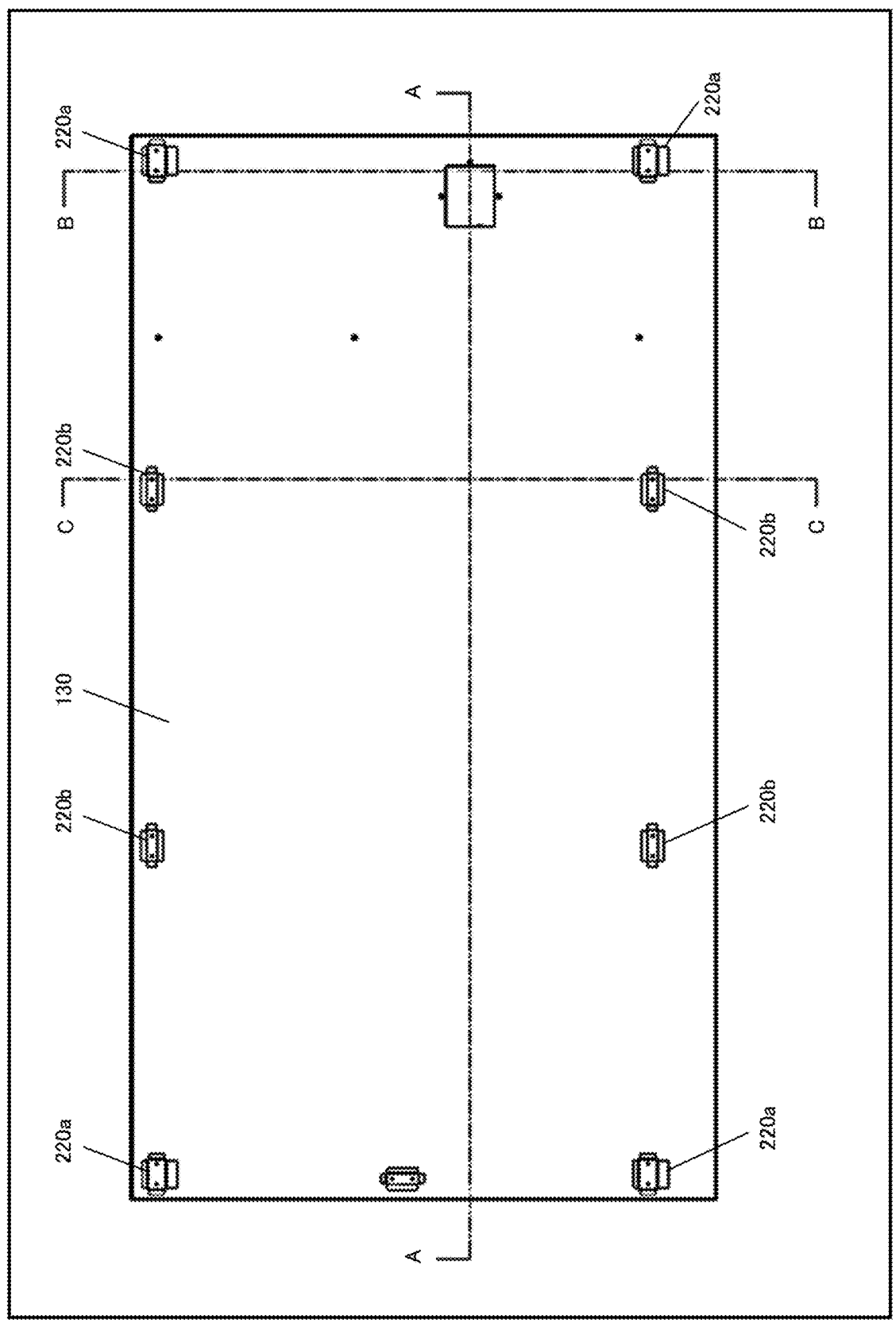

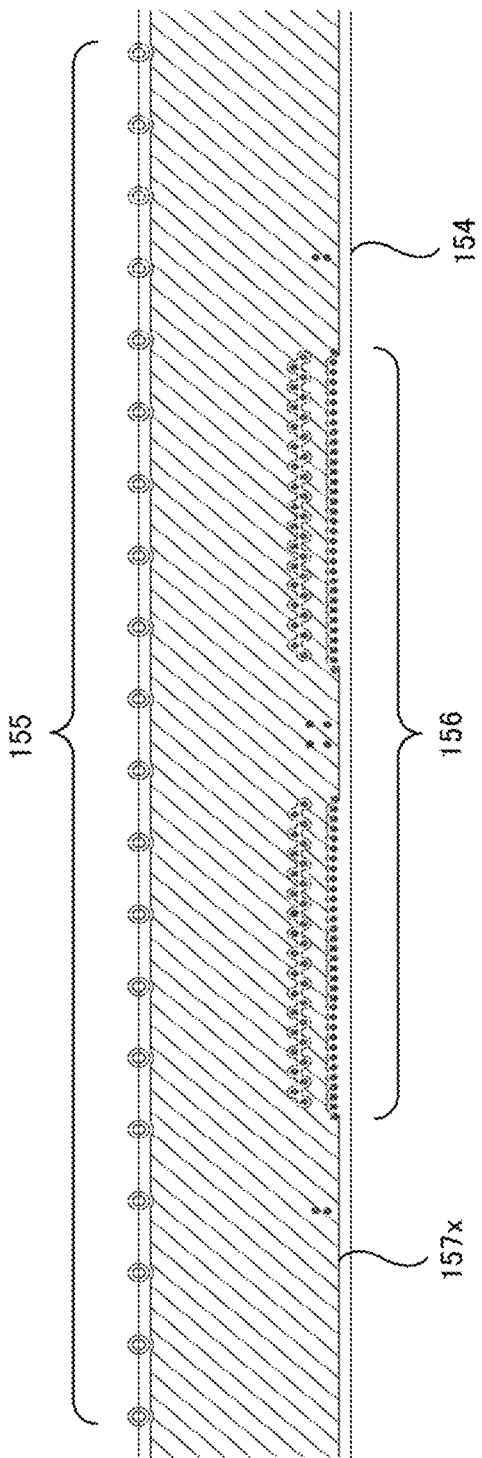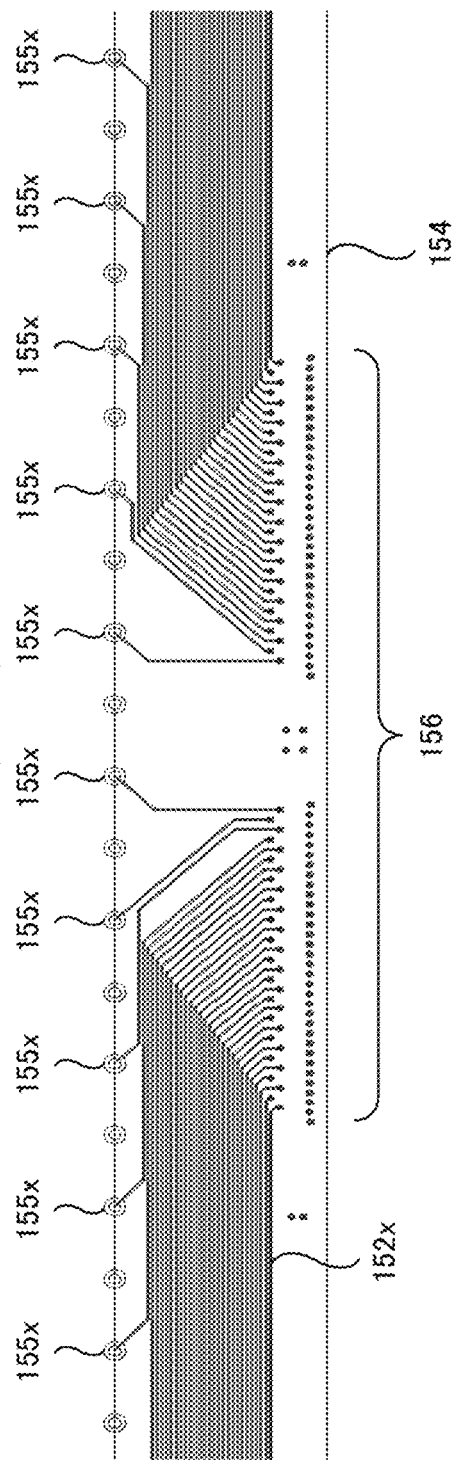

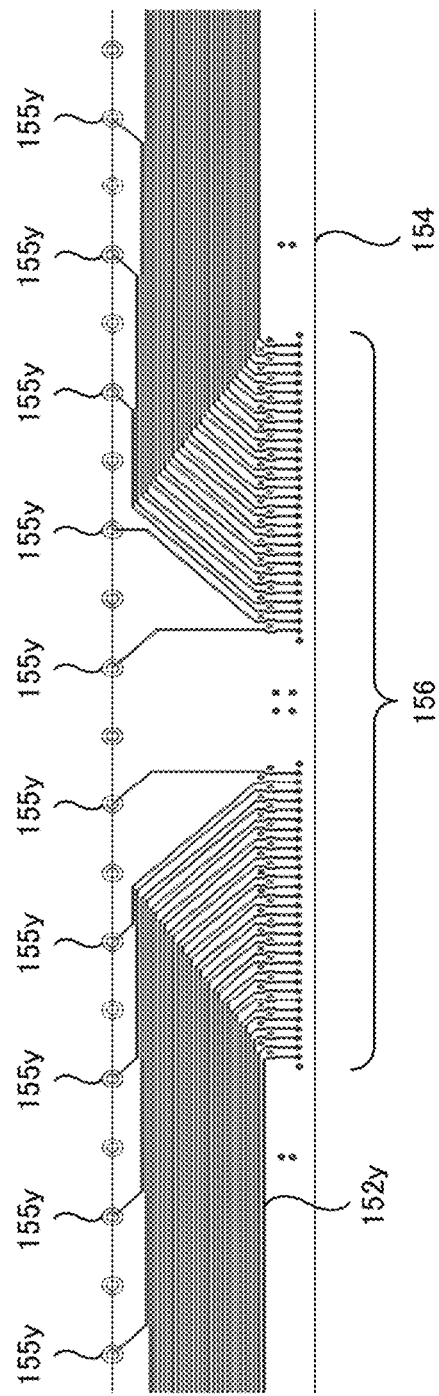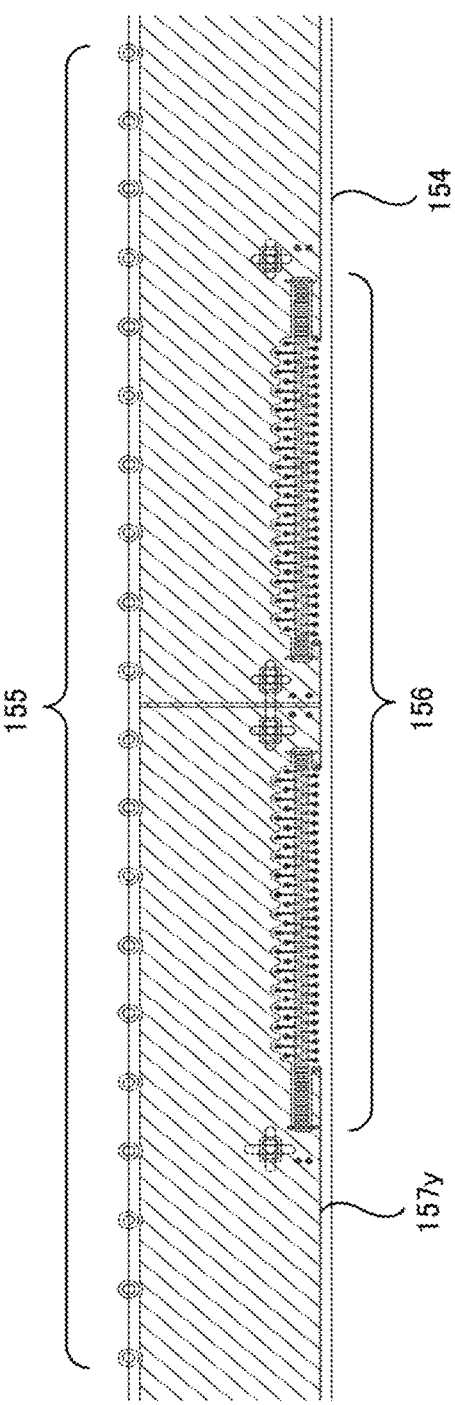

ELECTRONIC BOARD

BACKGROUND OF THE INVENTION

Field of the Invention

The present disclosure relates to an electronic board on which handwriting, such as characters, written by using writing instruments can be remained.

Description of the Related Background Art

Electronic boards provided with touch panel displays (display-type electronic boards) have been proposed. In display-type electronic boards, an image based on, for example, document data and image data are displayed on a display screen, and writing information handwritten on the display screen by using, for example, an electronic pen is displayed on the display screen as an image. Further, in display type electronic boards, it is possible to save or print a displayed image to which writing information is added (see, for example, Japanese Unexamined Patent Application Publication No. 2004-188736).

SUMMARY OF THE INVENTION

The conventional electronic boards use displays for displaying images based on, for example, image data and writing information. Due to this, such electronic boards are complicated in configuration of the electronic boards and are high in cost.

The present disclosure provides an electronic board with a simple configuration at a low cost.

An electronic board according to an aspect of the present disclosure is an electronic board capable of detecting a contact position on a writing board, comprising: a sensor sheet including a plurality of first electrode wires extending in a first direction, and a plurality of second electrode wires extending in a second direction crossing the first direction; and a chassis that fixes the sensor sheet, wherein a first sensor substrate to which the plurality of first electrode wires are connected is connected to an end in the first direction of the sensor sheet, a second sensor substrate to which the plurality of second electrode wires are connected is connected to an end in the second direction of the sensor sheet, and at least one of the first sensor substrate and the second sensor substrate is disposed on a back surface of the chassis with a portion close to an end of the sensor sheet being bent to cover an end of the chassis.

According to the present disclosure, it is possible to provide an electronic board with a simple configuration at a low cost.

BRIEF DESCRIPTION OF THE DRAWINGS

FIG. 6A illustrates an example of a definition for relating a resonance frequency to an attribute of a pen in a handwriting input system according to an embodiment of the present disclosure;

FIG. 6B illustrates an example of a definition for relating a resonance frequency to an attribute of a pen in a handwriting input system according to an embodiment of the present disclosure;

FIG. 7 is a back view of an electronic board according to an embodiment of the present disclosure;

FIG. 28A illustrates a configuration of a sensor substrate of an electronic board according to an embodiment of the present disclosure;

FIG. 28B illustrates a configuration of a sensor substrate of an electronic board according to an embodiment of the present disclosure;

FIG. 29A illustrates a configuration of a sensor substrate of an electronic board according to an embodiment of the present disclosure; and FIG. 29B illustrates a configuration of a sensor substrate of an electronic board according to an embodiment of the present disclosure.

DESCRIPTION OF THE PREFERRED EMBODIMENTS

The present disclosure will be described in detail below with reference to the drawings. The following description is considered in all respects as exemplificative and not restrictive.

Figure 1:
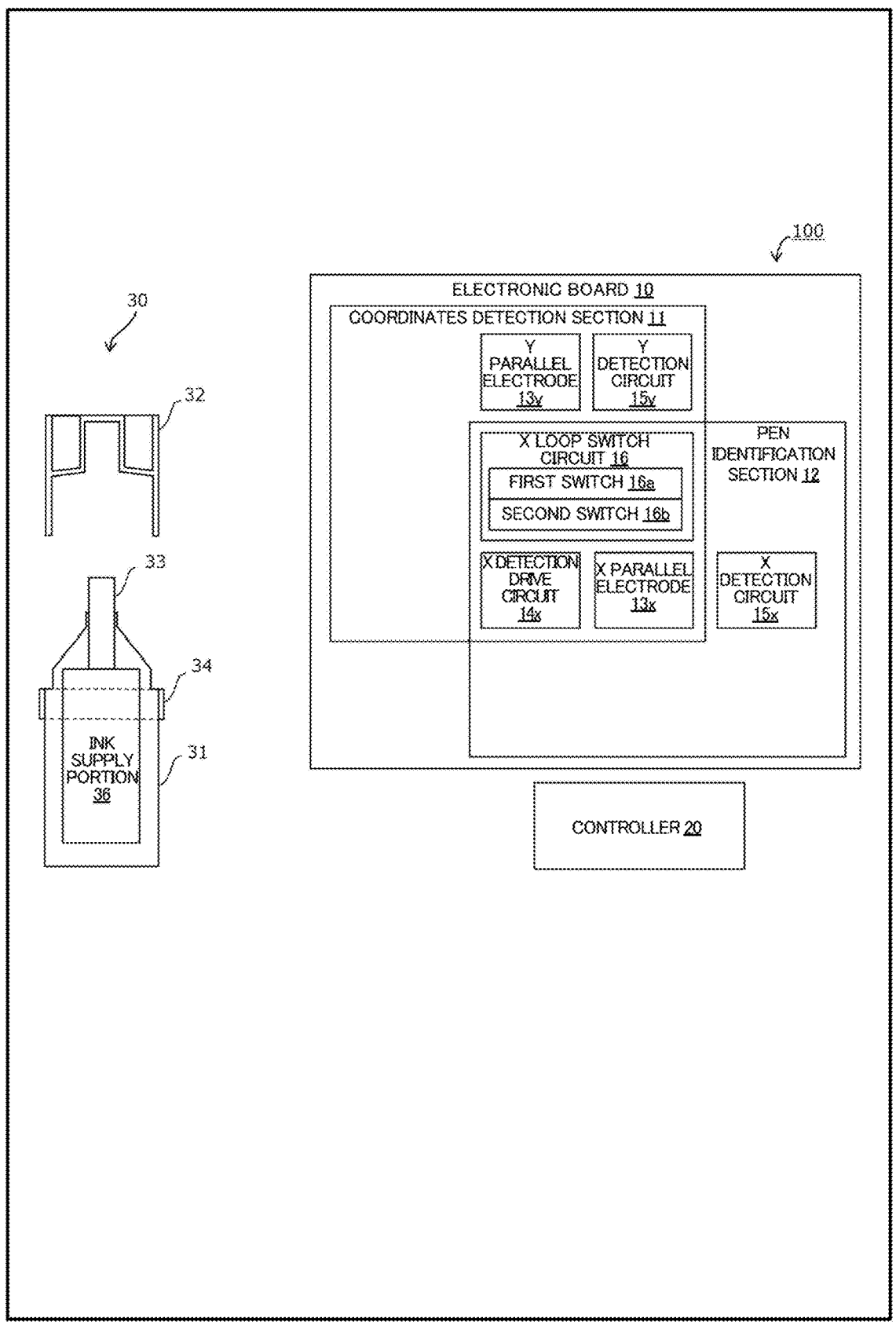
FIG. 1 illustrates an example of a configuration of a handwriting input system according to an embodiment of the present disclosure.
Figure 2:
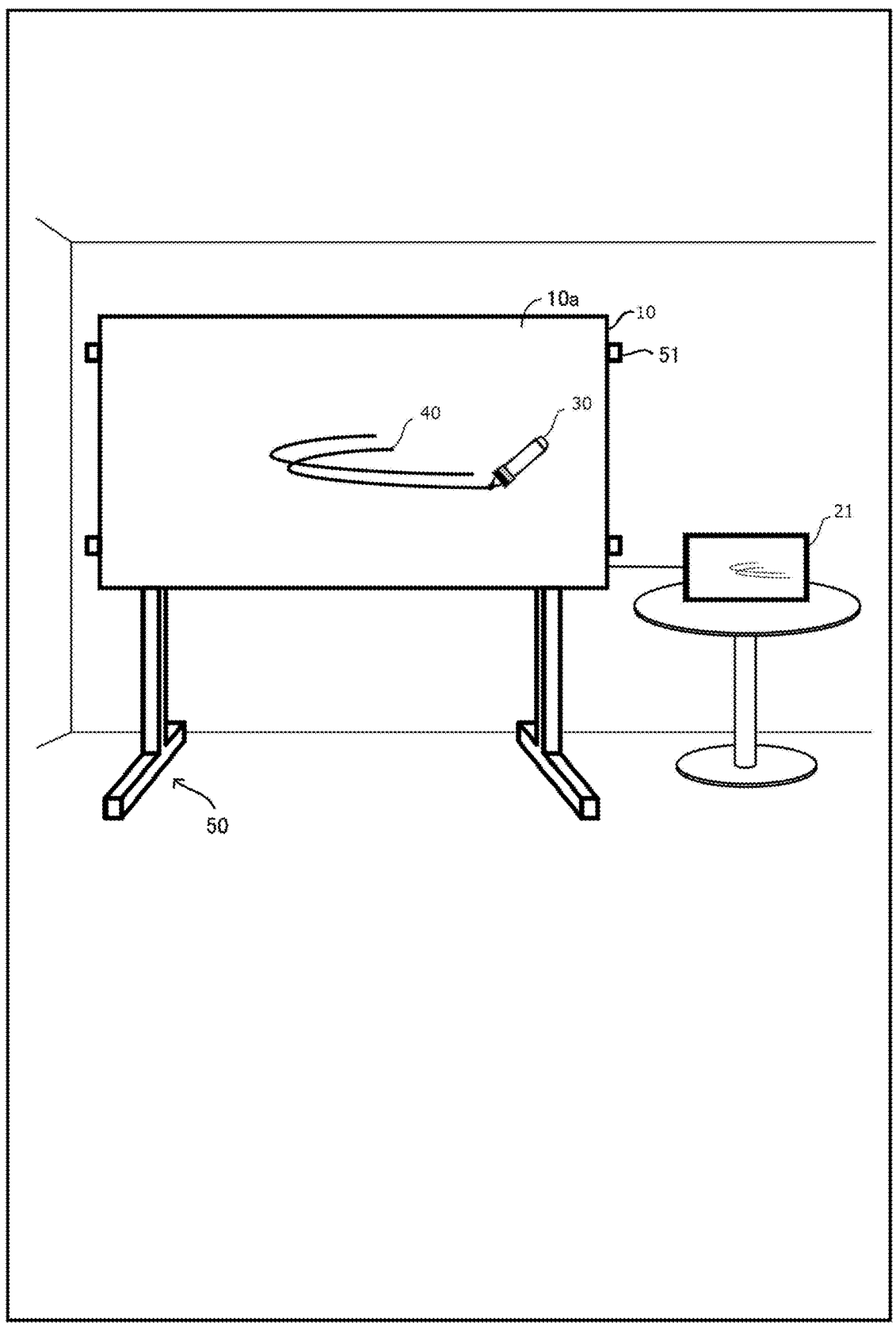
FIG. 2 illustrates an example usage of a handwriting input system according to an embodiment of the present disclosure.
Figure 3:
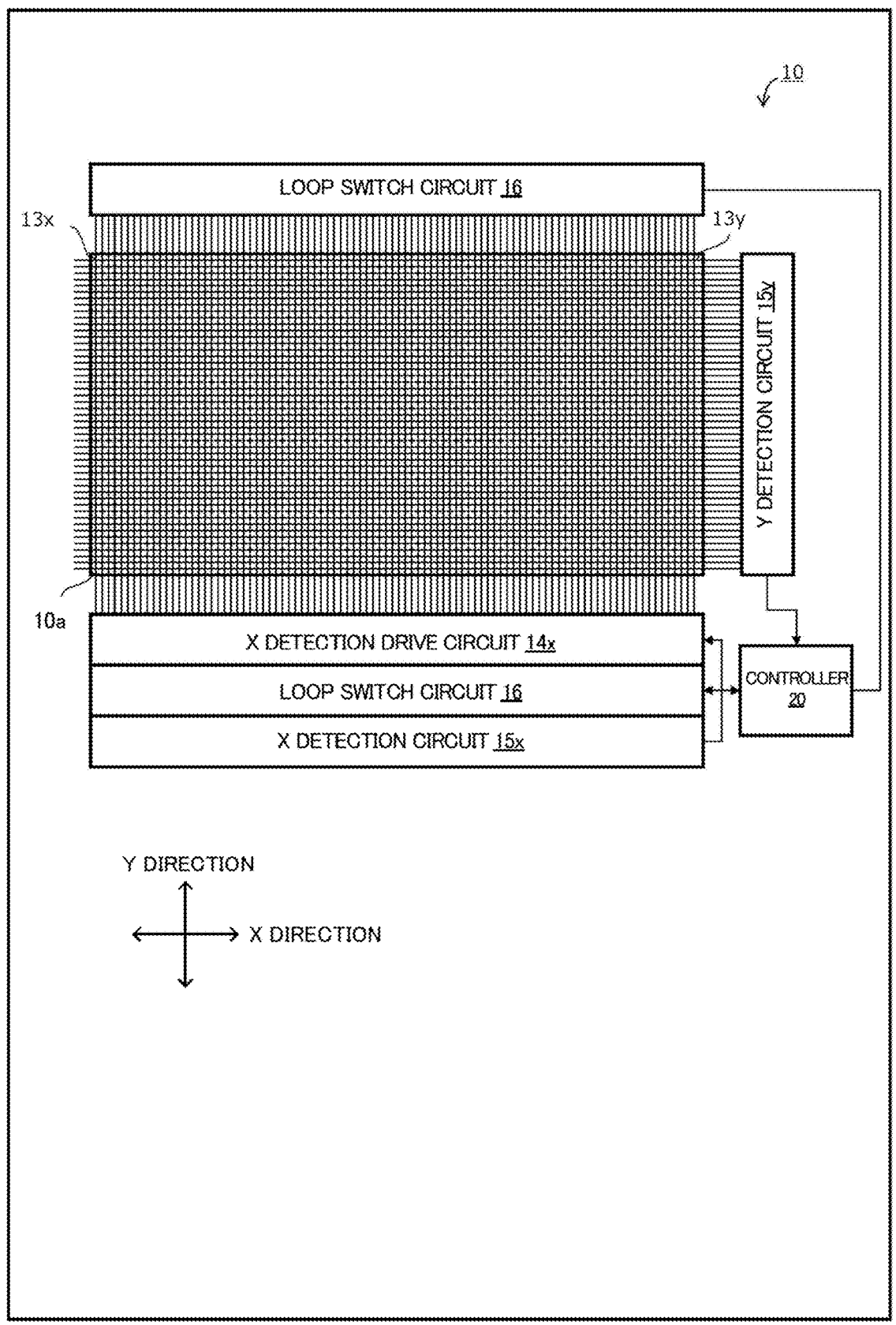
FIG. 3 illustrates an arrangement of X parallel electrode wires and Y parallel electrode wires in an electronic board according to an embodiment of the present disclosure.
Figure 4:
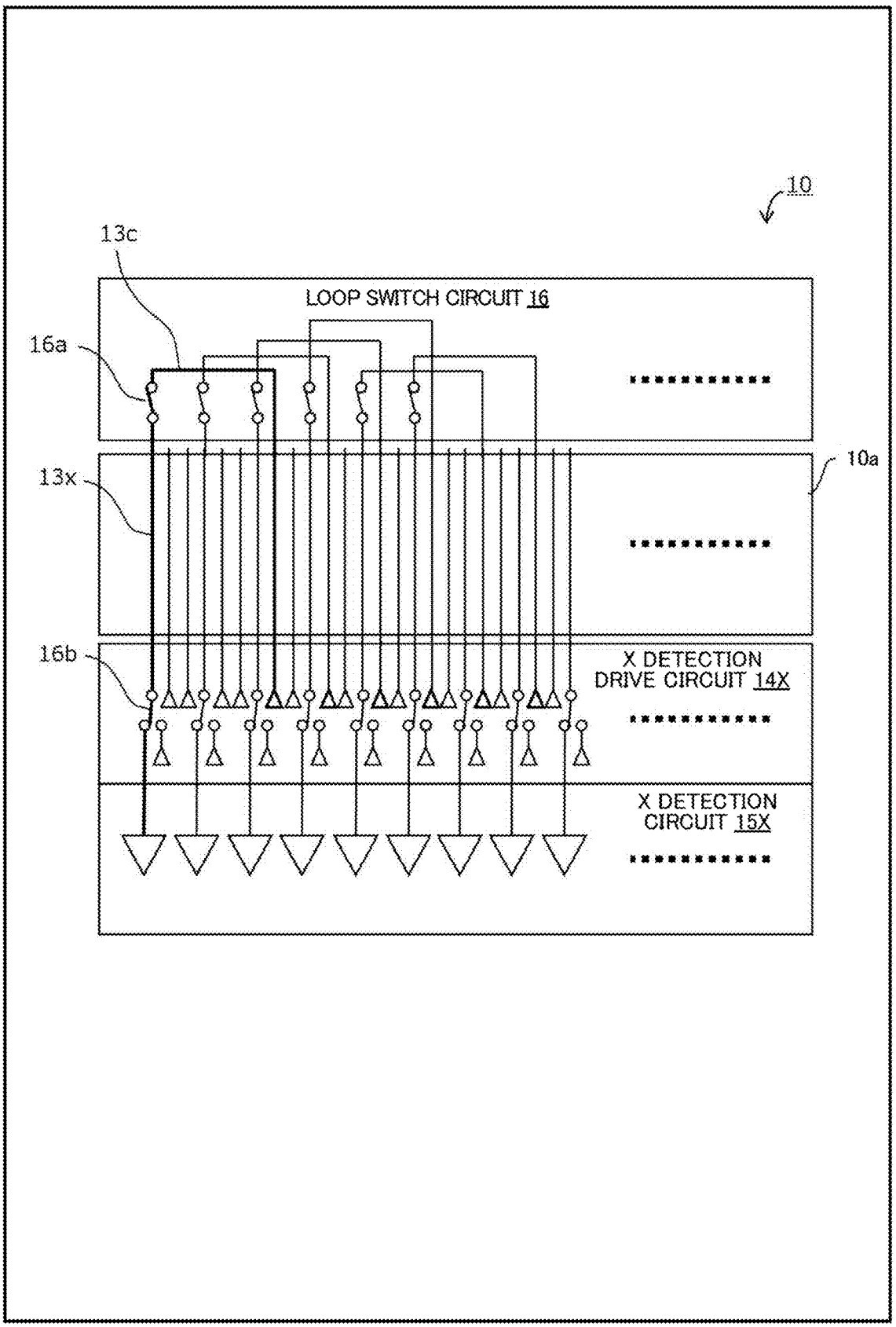
FIG. 4 is a diagram for describing a function of a loop switching circuit in an electronic board according to an embodiment of the present disclosure.
Figure 5:
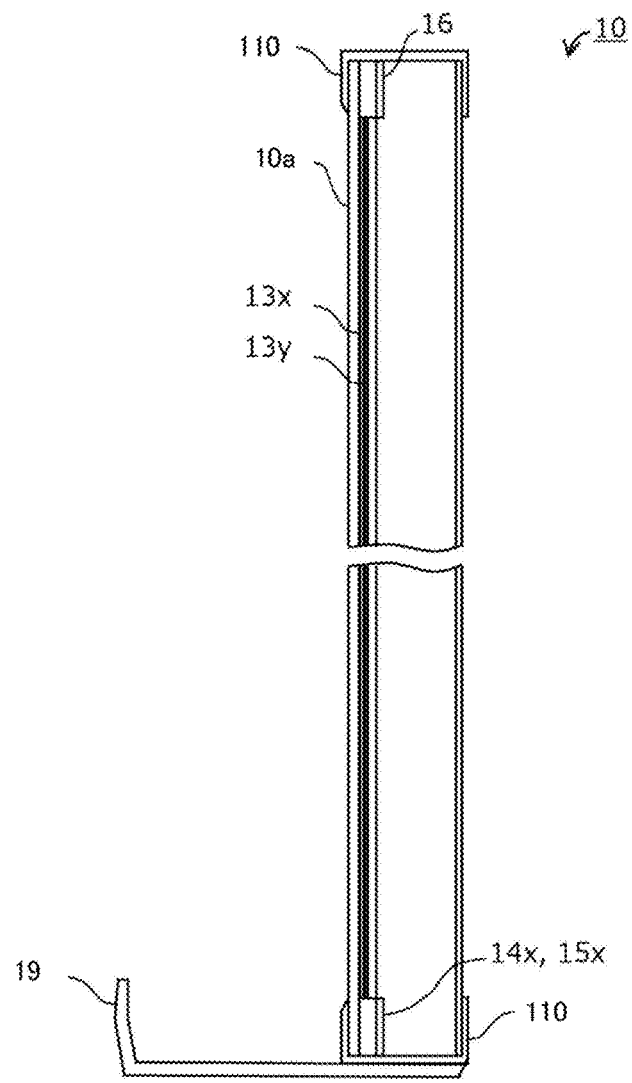
FIG. 5 is a sectional view in a vertical direction schematically illustrating a configuration of an electronic board according to an embodiment of the present disclosure.

FIG. 1 illustrates an example of a configuration of a handwriting input system 100 according to an embodiment of the present disclosure. FIG. 2 illustrates an example of usage of the handwriting input system 100 illustrated in FIG. 1. FIG. 3 illustrates a configuration of an electronic board, specifically, an arrangement of X parallel electrode wires and Y parallel electrode wires according to an embodiment of the present disclosure. FIG. 4 illustrates a function of a loop switching circuit in the electronic board illustrated in FIG. 1. FIG. 5 is an explanatory view schematically illustrating an outline of a configuration in a vertical cross section of the electronic board illustrated in FIG. 1.

The handwriting input system 100 illustrated in FIG. 1 mainly includes a pen 30 and an electronic board 10 in short. The pen 30 is a writing instrument including a pen body 31, a cap 32, a pen tip 33, an identification component 34, and an ink supply portion 36. The pen 30 is illustrated in FIG. 1 in such a manner that the shape of the pen 30 can be understood. The identification component 34 includes an identification circuit, which is not illustrated in FIG. 1. A specific configuration of the identification component 34 will be described later.

The cap 32, detachable from the pen body 31, covers the pen tip 33 when attached to the pen body 31 so that the pen tip 33 is not exposed.

The pen tip 33 is made of, for example, a felt material impregnated with ink. The pen tip 33 can typically be configured as a marker pen for a white board. The pen tip 33 is exposed when the cap 32 is removed. When a point of the pen tip 33 touches a writing board 10a which is a writable area of the electronic board 10, ink adheres to the contact position and leaves as visible handwriting 40 on the electronic board 10 (see FIG. 2).

An end of the pen tip 33 opposite to the point is in contact with the ink supply portion 36 storing ink, so that ink is supplied from the ink supply portion 36 to the pen tip 33 by capillarity.

The identification component 34 is attached around the periphery of the pen body 31 near the position in which the cap 32 is attached. The identifier component 34 includes an identification circuit which is not illustrated in FIG. 1. The identification circuit is formed by, for example, an LC resonance circuit including an inductance component L and a capacitor component C.

The writing board 10a is made of a material on which handwriting written by using the pen 30 remains. It is desirable that the writing board 10a is also made of a material on which handwriting is erasable. The writing board 10a may be disposable if the writing board 10a is made inexpensively, but the writing board 10a is desirably made of a material on which handwriting is erasable so that handwriting can be written repeatedly. For example, the writing board 10a is made of a resin material. In a case where the pen 30 is a marker pen, the writing board 10a has a surface like a marker board.

As illustrated in FIG. 5, the electronic board 10 is covered by a bezel 110 which is a frame member to improve strength. A front surface of the electronic board 10 covered by the bezel 110 is the writing board 10a, which is a writable area. A pen holder 19 (pen tray) is disposed at a lower end of the electronic board 10. As described later, the pen holder 19 may be formed integrally with a part of the bezel 110 (a later-described lower bezel 110a).

As illustrated in FIG. 1, the electronic board 10 includes a coordinates detection section 11 and a pen identification section 12 in short functionally.

The coordinates detection section 11 (an example of a position detection section of the present disclosure) detects the coordinates of the position at which the pen tip 33 of the pen 30 touches the electronic board 10 (the writing board 10a). The pen identification section 12 detects an identification signal from the identifier component 34 attached to the pen 30.

In one configuration example that implements these functions, the coordinates detection section 11 operates as a capacitance-type touch panel. Further, the pen identification section 12 operates as an electromagnetic induction circuit and detects an identification signal from the identification component 34.

The coordinates detection section 11 includes Y parallel electrode wires 13y, a Y detection circuit 15y, X parallel electrode wires 13x, an X detection drive circuit 14x, and a loop switching circuit 16. The coordinates detection section 11 share hardware of the X parallel electrode wires 13x and the X detection drive circuit 14x with the pen identification section 12. The loop switching circuit 16 switches a loop between a case in which the shared hardware is used for the coordinates detection section 11 and a case in which the shared hardware is used for the pen identification section 12.

The pen identification section 12 includes the X parallel electrode wires 13x, the X detection drive circuit 14x, the loop switching circuit 16, which are shared with the coordinates detection section 11, and additionally, an X detection circuit 15x.

The X parallel electrode wires 13x (an example of first electrode wires of the present disclosure) are a plurality of electrode wires embedded in the electronic board 10 (writing board 10a) near a front surface thereof on which writing is performed by using the pen 30. The X parallel electrode wires 13x are arranged side by side in the X direction (horizontal direction) (an example of a second direction of the present disclosure) and extend in the Y direction (longitudinal direction) (an example of a first direction of the present disclosure) (see FIG. 3).

The Y parallel electrode wires 13y (an example of second electrode wires of the present disclosure) are a plurality of electrode wires embedded in the electronic board 10 (writing board 10a) near a front surface thereof on which writing is performed by using the pen 30. The Y parallel electrode wires 13y are arranged side by side in the Y direction (vertical direction) and extend in the X direction (horizontal direction) (see FIG. 3). The electrode wires of the Y parallel electrode wires 13y are embedded at a depth (layer) different from the depth at which the electrode wires of the X parallel electrode wires 13x are embedded. Accordingly, the electrode wires of the Y parallel electrode wires 13y cross the electrode wires of the X parallel electrode wires 13x with an insulating layer of a given thickness being interposed therebetween, and thus the Y parallel electrode wires 13y and the X parallel electrode wires 13x do not come into contact with each other (see FIG. 5). The X parallel electrode wires 13x and the Y parallel electrode wires 13y are made of, for example, copper wires.

Since the X parallel electrode wires 13x and the Y parallel electrode wires 13y are disposed near the front surface of the writing board 10a, an aluminum plate, which electrically shields the X parallel electrode wires 13x and the Y parallel electrode wires 13y, and a steel plate, which magnetically shields the X parallel electrode wires 13x and the Y parallel electrode wires 13y, are not suitable for the material for the writing board 10a. Rather, a resin material such as a melamine coated epoxy resin material or a polycarbonate resin material, for example, is preferably applicable.

As illustrated in FIG. 3, the X detection drive circuit 14x is connected to one end of each of the X parallel electrode wires 13x, and applies a given voltage to each of the X parallel electrode wires 13x. The given voltage may vary between a case in which the X detection drive circuit 14x functions as part of the coordinates detection section 11 and a case in which the X detection drive circuit 14x functions as part of the pen identification section 12. The X detection drive circuit 14x sequentially applies an impulse voltage from the left-side X parallel electrode wire 13x to the right-side X parallel electrode wire 13x.

The Y detection circuit 15y detects the magnitude of voltage or current induced in each electrode wire of the Y parallel electrode wires 13y when driven by the X detection drive circuit 14x. The magnitude of voltage or current depends on the magnitude of the coupling capacitance between the electrode wires of the X parallel electrode wires 13x and the electrode wires of the Y parallel electrode wires 13y. The coupling capacitance between the electrode wires of the X parallel electrode wires 13x and the electrode wires of the Y parallel electrode wires 13y differs between a case in which a dielectric or a metal material touches onto a portion of the electronic board 10 underneath which the X parallel electrode wires 13x cross the Y parallel electrode wires 13y, and a case in which no dielectric or metal material does not touch onto that portion. For example, the coupling capacitance increases when the pen tip 33 impregnated with ink, or a human finger, touches the electronic board 10, because these are dielectric objects. Therefore, by detecting the change of coupling capacitance, the coordinates of a position in which the pen tip 33 or a human finger touches onto the electronic board 10 can be detected. This is known as the operation of the capacitance-type touch panel.

Since the magnitude of coupling capacitance typically varies between a human finger and the pen tip 33, whether a human finger or the pen tip 33 is being used may be determined by the difference in the magnitude of coupling capacitance in addition to detection of the coordinates of a contact position on the electronic board 10.

As illustrated in FIG. 4, the loop switching circuit 16 includes a first switch 16a for switching connection and disconnection of two X parallel electrode wires 13X at one end thereof, which are the two electrode wires being spaced at a given distance from each other among the plurality of X parallel electrode wires. Coupling a pair of X parallel electrode wires 13x on one end by using the first switch 16a forms a U-shaped current path. The U-shaped current path functions as an induction coil of the pen identification section 12. A second switch 16b is disposed at one end of the U-shaped current path.

The second switch 16b operates synchronously with the first switch 16a. In a state in which the first switch 16a disconnects the pair of X parallel electrode wires 13x, the second switch 16b connects one of the X parallel electrode wires 13x to the X detection drive circuit 14x. Conversely, in a state in which the first switch 16a connects the pair of X parallel electrode wires 13x, the second switch 16b connects one of the X parallel electrode wires 13x to the X detection circuit 15x. Therefore, when a pair of X parallel electrode wires is disconnected from each other, each X parallel electrode wire is driven by the corresponding X detection drive circuit 14x.

By contrast, when a pair of X parallel electrode wires 13x is connected to each other and a U-shaped current path is formed as an induction coil, the second switch 16b couples one X parallel electrode wire 13x of the U-shaped current path to the X detection circuit 15x. The other side of the X parallel electrode wire of the U-shaped current path is not coupled to a switch and is driven by the X detection drive circuit 14x.

In this embodiment, a plurality of U-shaped current paths serving as induction coils is arranged in the X direction (horizontal direction).

When the loop switching circuit 16 causes the X parallel electrode wires 13x to operate as the pen identification section 12, for example, the plurality of induction coils is driven sequentially from the left side to the right side thereof. In FIG. 4, to illustrate that only the left side induction coil is driven, an induction coil 13c on the left side is illustrated with a thicker line than the lines of other induction coils. While changing the driving frequency, the X detection drive circuit 14x drives the other end of the induction coil 13c as a U-shaped current path. The X detection circuit 15x that is connected to one end of the induction coil 13c detects the magnitude of current that corresponds to the frequency and that flows in the induction coil 13c. Subsequently, the same detection is performed for the induction coil adjacent to the right and proceeds sequentially to the right-side induction coil.

The loop switching circuit 16 is necessary for sharing the X parallel electrode wires 13x between the coordinates detection section 11 and the pen identification section 12.

When the identification component 34 is positioned near an induction coil and the induction coil is driven at a driving frequency corresponding to the resonant frequency of the identifier component 34, a large resonant current flows in a resonance circuit due to electromagnetic coupling with the induction coil. Consequently, a large current flows in the induction coil. By detecting the magnitude of the current in the X detection circuit 15x, it can be detected that the identifier component 34 of what resonant frequency exists in which area in the X direction.

In this embodiment, the resonant frequency of the identifier component 34 is determined in advance in association with attributes of the pen 30.

FIGS. 6A and 6B are tables illustrating examples of definitions by which a resonant frequency f0 and the attributes of the pen 30 are associated with each other in accordance with this embodiment. A list illustrated in FIG. 6A shows an example in which the resonant frequency f0 of the identification component 34 is associated with the ink color of the pen (the writing color). Different resonant frequencies f0 are determined for pens of different colors: black, blue, green, yellow, orange, and red. In accordance with the writing color of the pen, a user attaches the identifier component 34 that has the resonant frequency f0 associated with the writing color.

A list illustrated in FIG. 6B shows an example in which not only the writing color of the pen 30 but also the attributes such as the pen tip size and the shape of the pen tip are determined in association with the resonant frequency f0 correspondingly to respective combinations of these attributes. By determining in advance the resonant frequency f0 uniquely corresponding to a combination of a plurality of kinds of attributes as illustrated in the list in FIG. 6B, a plurality of kinds of attributes associated with the detected resonant frequency f0 can be obtained. The resonance frequency f0 is not limited to the values illustrated in FIGS. 6A and 6B, and is selected based on the balance of the size and the oscillation energy (intensity) of a resonance coil 341 of the identifier component 34. The resonance frequency f0 may be determined, for example, in the range of 400 to 700 kHz.

When the coordinates detection section 11 detects the position coordinates of the pen tip 33 in the area in which the pen identification section 12 detects the existence of the identifier component 34, handwriting data according to the attributes of the pen corresponding to the position coordinates and the identification information can be generated.

The handwriting data may be generated by, for example, causing a personal computer to execute a dedicated processing program in accordance with the information detected by the coordinates detection section 11 and the pen identification section 12. Alternatively, by incorporating a microcomputer into the electronic board 10, not only the processing performed by the coordinates detection section 11 and the pen identification section 12 but also the processing for generating the handwriting data may be performed by the microcomputer.

In FIG. 1, a controller 20 represents a section that performs processing for generating handwriting data. The controller 20 is formed mainly by a central processing unit (CPU) or a microcomputer, and also by peripheral circuits such as a timer and an input/output circuit and memory.

The controller 20 may be separated from the electronic board 10 or integrated onto the electronic board 10, that is, incorporated onto the electronic board 10; in other words, the controller 20 may perform processing outside the handwriting input system 100 according to this embodiment or may be included in the handwriting input system 100. In the former case, the handwriting input system 100 detects and provides information which serves as the basis for generating handwriting data. In the latter case, the handwriting input system 100 is arranged to further carry out the processing for generating handwriting data.

When the processing of the handwriting input system 100 according to this embodiment of the present disclosure includes the generation of handwriting data, for example, a display device 21 may be connected to the controller 20 as illustrated in FIG. 2 and the generated handwriting data may be displayed in real time. Even if the content is not displayed on the display device 21, handwriting 40 written by using the pen 30 remains on the writable area 18 of the electronic board 10.

The display device 21 is effective in checking that the handwriting data generated by the controller 20 matches the handwriting 40 in the writable area 18.

The handwriting data reflects the attributes of the pen 30. For example, according to the definition illustrated in FIG. 6A, the writing color of the handwriting data displayed on the display device 21 matches the writing color of the handwriting 40. Furthermore, according to the definition illustrated in FIG. 6B, the thickness and the shape of the line of the displayed handwriting data reflects the size and the shape of the pen tip 33. If a hard copy of the handwriting data is printed by using a color printer (not illustrated), the obtained hard copy reflects the writing color or the pen point size and shape.

Configuration of Electronic Board

Next, a specific configuration of the electronic board 10 according to an embodiment of the present disclosure will be described. The electronic board 10 is installed, for example, on a stand 50 or on a wall as illustrated in FIG. 2. Further, the electronic board 10 may be, for example, hooked to a frame 51 of the stand 50 to be installed removably.

Figure 8:
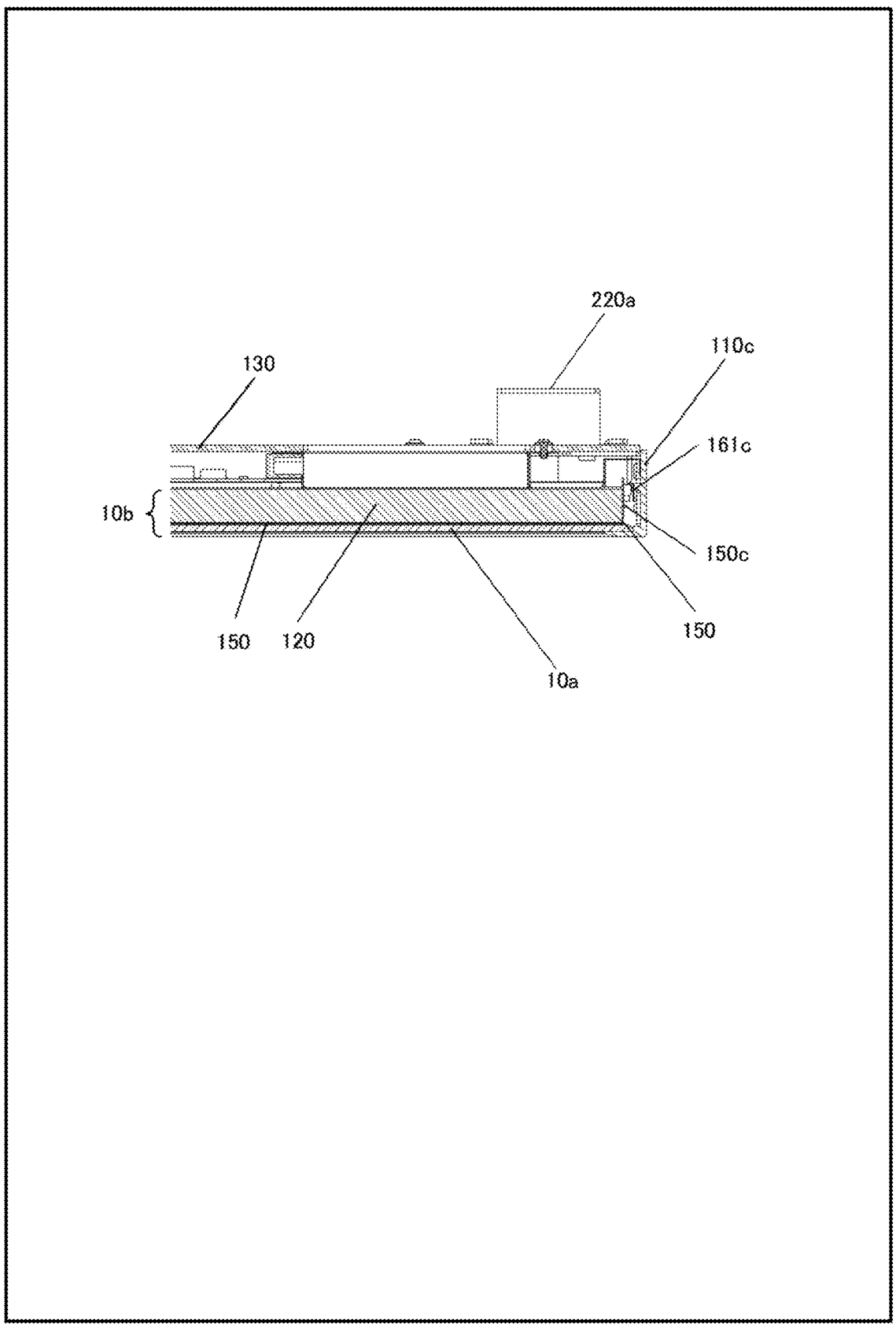
FIG. 8 illustrates a part (right end) of a cross section along line A-A of FIG. 7.
Figure 9:
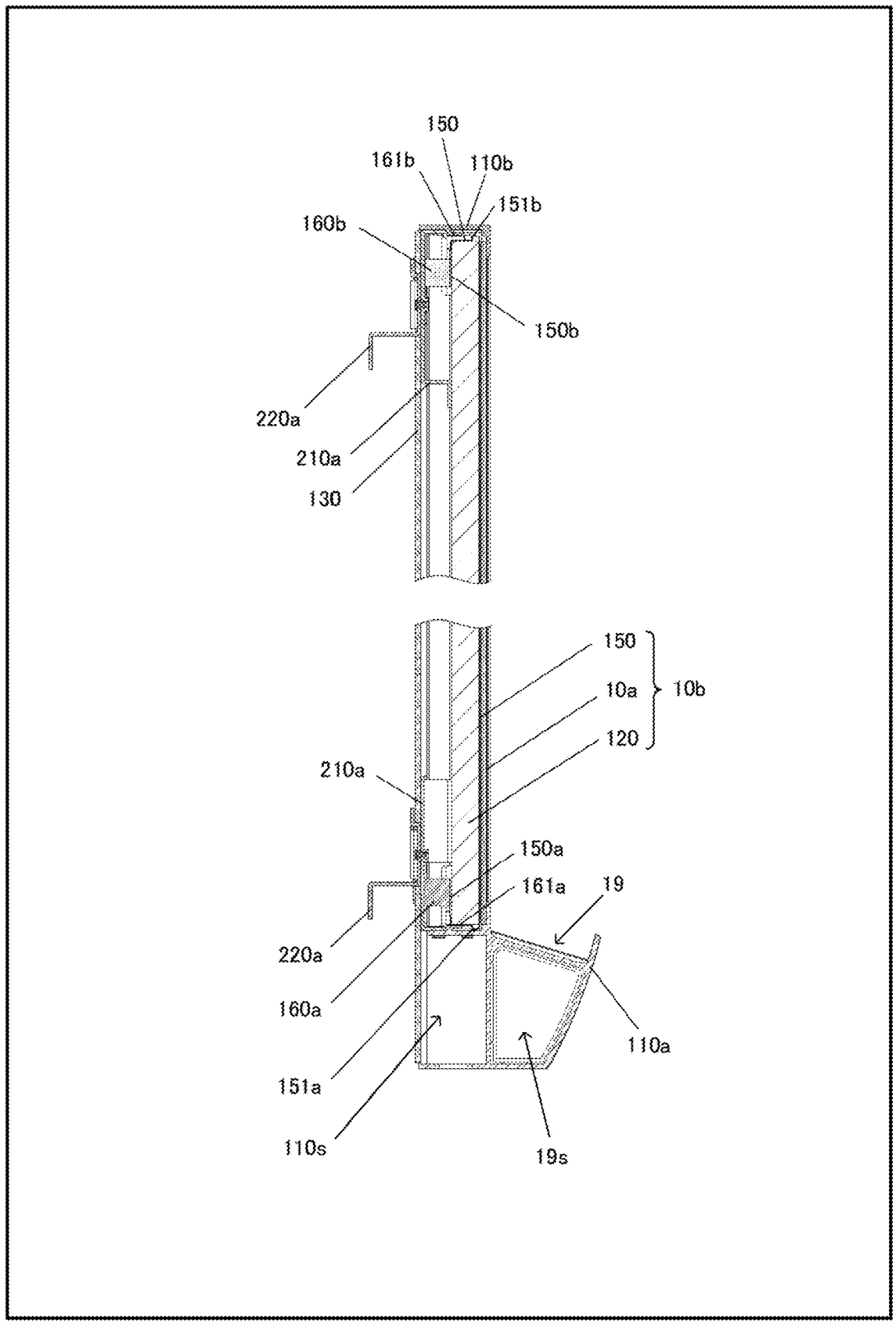
FIG. 9 illustrates a part (upper end, lower end) of a cross section along line B-B in FIG. 7.
Figure 10:
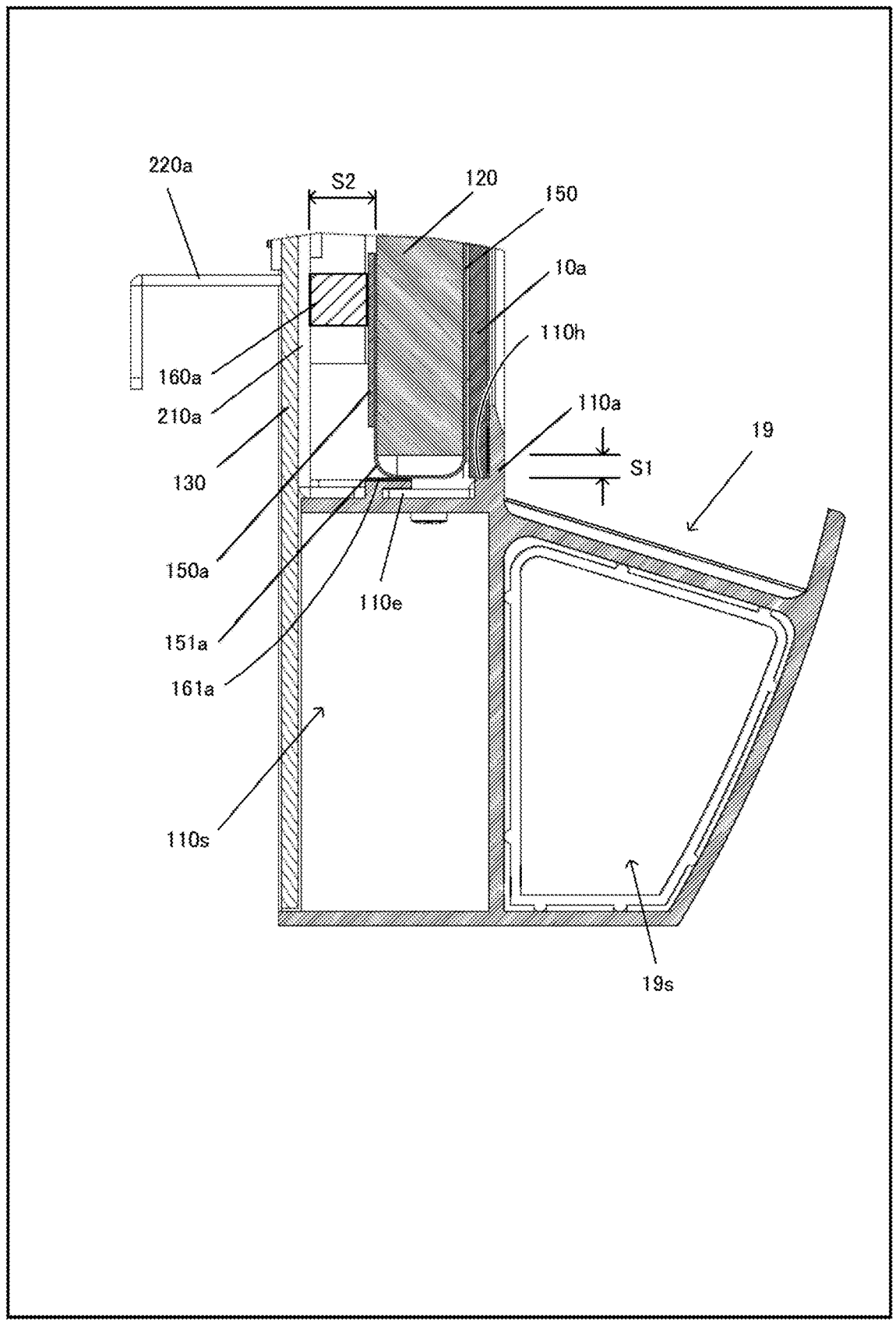
FIG. 10 illustrates a part (lower end) of the cross section along line B-B in FIG. 7.
Figure 11:
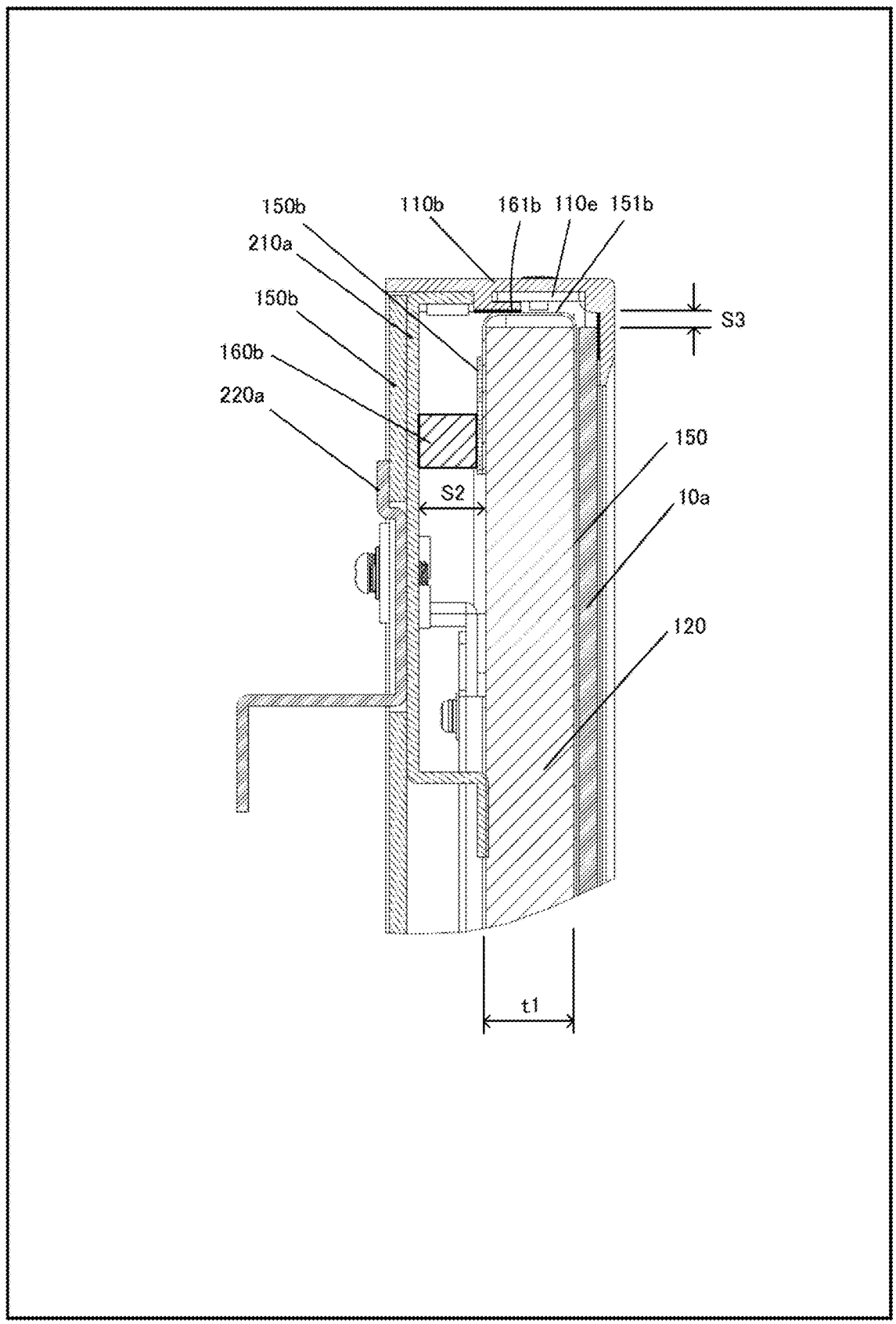
FIG. 11 illustrates a part (upper end) of the cross section along line B-B in FIG. 7.
Figure 12:
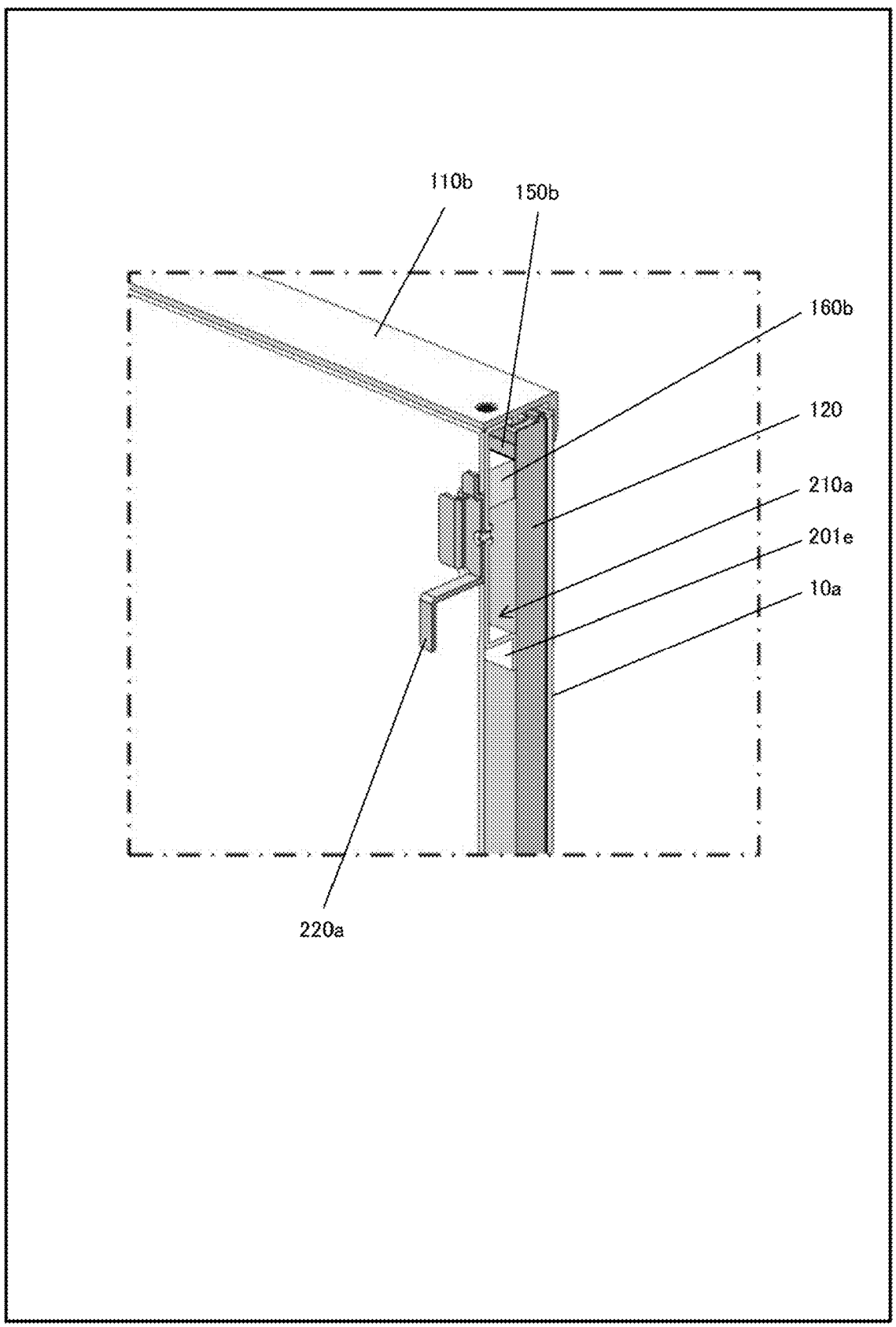
FIG. 12 is a perspective view illustrating a part (upper end) of a cross section along line A-A of FIG. 7.
Figure 13:
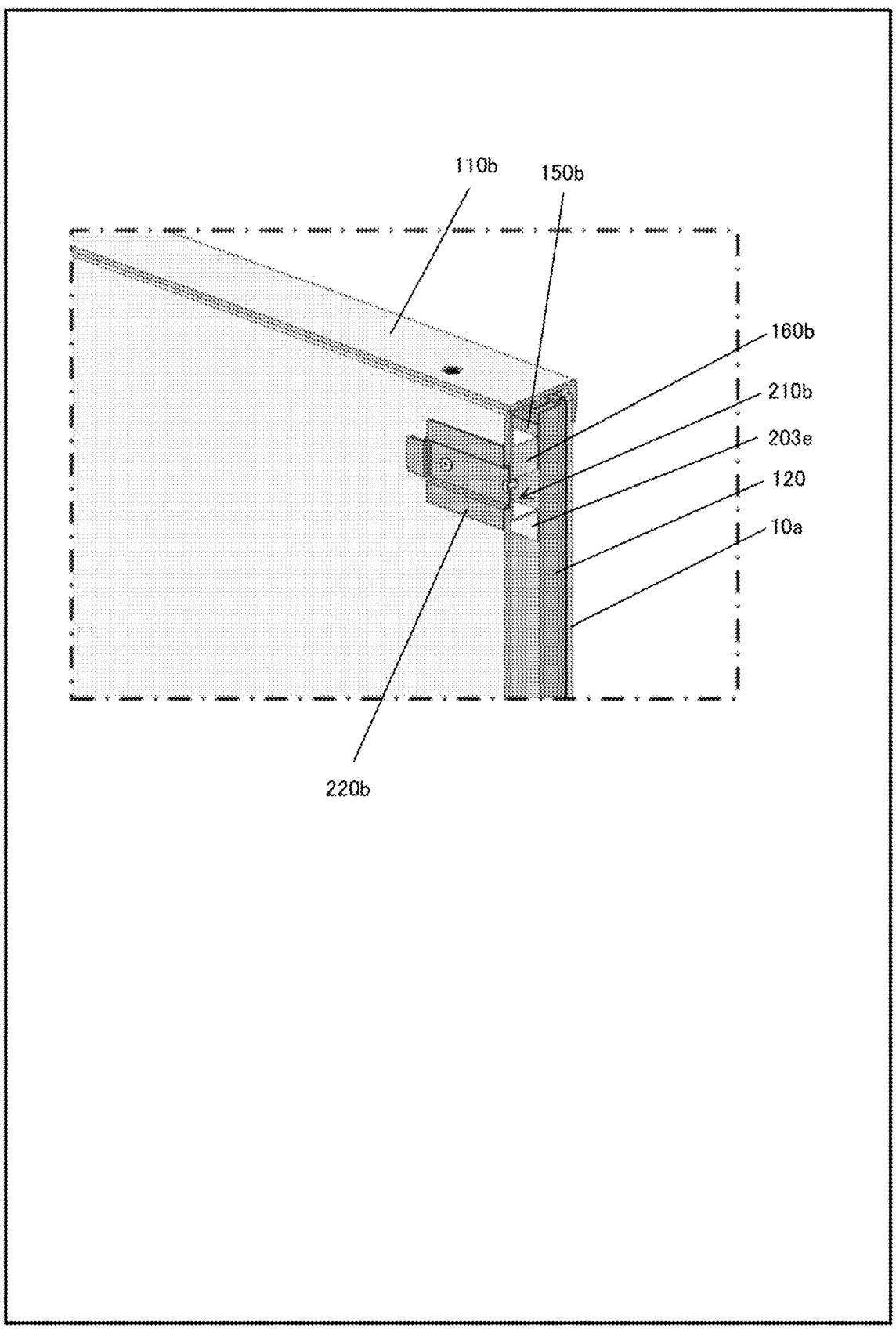
FIG. 13 is a perspective view illustrating a part (upper end) of a cross section along line C-C of FIG. 7.

FIG. 7 is a back view of the electronic board 10 in this embodiment as viewed from the back side. FIG. 8 illustrates a part (right end) of a cross section along line A-A of FIG. 7. FIG. 9 illustrates a part (upper end, lower end) of a cross section along line B-B in FIG. 7. FIG. 10 illustrates a part (lower end) of a cross section along line B-B in FIG. 7. FIG. 11 illustrates a part (upper end) of a cross section along line B-B in FIG. 7. FIG. 12 is a perspective view illustrating a part. (upper part) of a cross section along line A-A of FIG. 7. FIG. 13 is a perspective view illustrating a part (upper part) of the cross section along line C-C of FIG. 7.

The electronic board 10 includes: the writing board 10a made of a resin material on which a handwriting 40 written by using the pen 30 remains; a sensor sheet 150 disposed on the back side of the writing board 10a; a chassis 120 disposed on the back side of the sensor sheet 150 and to which the sensor sheet 150 is attached; a back cover 130 disposed on the back side of the chassis 120 and covers the back side of the electronic board 10; and a bezel 110 that covers the periphery of the electronic board 10 and forms an outer frame of the electronic board 10.

The writing board 10a, the sensor sheet 150, and the chassis 120 are integrally bonded to each other by, for example, a double-sided tape and an adhesive (an example of the adhesive material of the present disclosure). The integrated writing board 10a, sensor sheet 150, and chassis 120 form a sensor unit 10b (see, for example, FIG. 8). The writing board 10a, the sensor sheet 150, and the chassis 120 are required only to be fixed to and formed integrally with each other. For example, peripheral side surfaces of the writing board 10a, the sensor sheet 150, and the chassis 120 may be integrally formed by using an adhesive or the like, or by using other members (screws, a frame, etc.).

Figure 14:
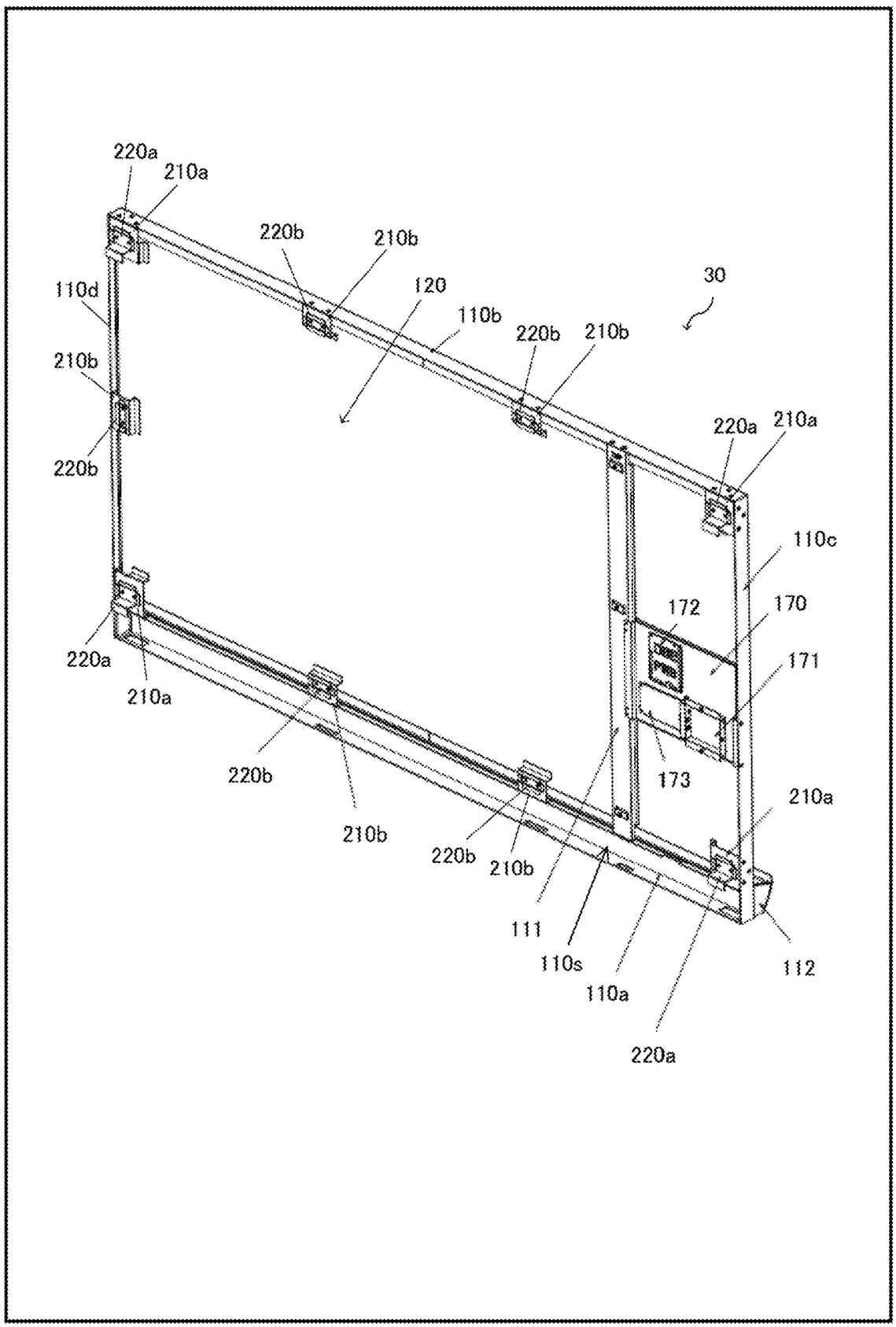
FIG. 14 is a perspective view of an electronic board according to an embodiment of the present disclosure as viewed from the back side.

The bezel 110 is formed in a frame shape by connecting a lower bezel 110a, an upper bezel 110b, a right bezel 110c, and a left bezel 110d to one another as illustrated in FIG. 14 (described later). The lower bezel 110a or the upper bezel 110b is an example of a first bezel of the present disclosure, and the right bezel 110c or the left bezel 110d is an example of a second bezel of the present disclosure. The sensor unit 10b is disposed inside the frame of the bezel 110, and a bracket (a corner reinforcing plate 210a and a chassis fixing plate 210b described later) for supporting the sensor unit 10b from the back side is attached to the back side of the sensor unit 10b. The back cover 130 is attached to the bracket.

As illustrated in FIG. 9, the pen holder 19 and spaces 110s and 19s for storing various types of wiring and the like are integrally formed in the lower bezel 110a.

The sensor sheet 150 includes a transparent film in which the X parallel electrode wires 13x described above are arranged, a transparent film in which the Y parallel electrode wires 13y are arranged, and an insulating film disposed between these electrode wires, which are made to adhere and fixed to each other by using, for example, a double-sided tape. The sensor sheet 150 is formed in a film shape as a whole and has flexibility. A sensor substrate 150a (an example of a first sensor substrate of the present disclosure) is connected to the lower end of the sensor sheet 150, a sensor substrate 150b is connected to an upper end of the sensor sheet 150, and a sensor substrate 150c (an example of a second sensor substrate of the present disclosure) is connected to a right end (or left end) of the sensor sheet 150. One end (lower end) of the X parallel electrode wire 13x is connected to the sensor substrate 150a, the other end (lower end) of the X parallel electrode wire 13x is connected to the sensor substrate 150a, and the other end (right end) of the Y parallel electrode wire 13y is connected to the sensor substrate 150c.

On the sensor substrate 150a, sensor wires (sensor wires 152x and 152y in FIGS. 28A, 28B, 29A and 29B) are disposed. One end of the sensor wire and one end of the X parallel electrode wire 13x are electrically connected. The other end of the sensor wire is electrically connected to a connector connecting portion (a connector connecting portion 156 in FIGS. 28A, 28B, 29A, and 29B) provided in the sensor substrate 150a. A relay wire (not illustrated) is connected to the connector connecting portion, and the relay wire is electrically connected to the X detection drive circuit 14x and the X detection circuit 15x described above.

A sensor wire is disposed on the sensor substrate 150b, and one end of the sensor wire is electrically connected to the other end of the X parallel electrode wire 13x. The other end of the sensor wire is electrically connected to the connector connecting portion provided in the sensor substrate 150b. A relay wire is connected to the connector connecting portion, and the relay wire is electrically connected to the above-described loop switching circuit 16.

A sensor wire is disposed on the sensor substrate 150c. One end of the sensor wire is electrically connected to the Y parallel electrode wire 13y. The other end of the sensor wire is electrically connected to a connector connecting portion provided in the sensor substrate. A relay wire is connected to the connector connecting portion, and the relay wire is electrically connected to the above-described Y detection circuit 15y. The relay wires are disposed on the back side of the chassis 120 and are connected to a controller substrate 172 (see FIG. 14). The specific configurations of the sensor substrates 150a, 150b, and 150c will be described later.

The sensor substrate 150a may be connected to the right end of the sensor sheet 150, the sensor substrate 150b may be connected to the left end of the sensor sheet 150, and the sensor substrate 150c may be connected to the upper end (or lower end) of the sensor sheet 150.

FIG. 14 is a perspective view of the electronic board 10 as viewed from the back side. In FIG. 14, the back cover 130 is omitted. A reinforcing plate 111 is disposed in the vertical direction on the back surface of the chassis 120. A lower end of the reinforcing plate 111 is screwed to the lower bezel 110a, an upper end of the reinforcing plate 111 is screwed to the upper bezel 110b, and a central portion of the reinforcing plate 111 is in contact with the back surface of the chassis 120. A substrate tray 170 is disposed between the reinforcing plate 111 and the right bezel 110c. An interface connection plate 171, a controller substrate 172, and an interface substrate 173 are mounted on the substrate tray 170. The controller 20, the X detection drive circuit 14x, the X detection circuit 15x, the loop switching circuit 16, the Y detection circuit 15y, and the like are mounted on the controller substrate 172. A cable (wire) to be connected to an external device such as a personal computer (PC) or a projector is connected, for example, to the interface substrate 173. In the handwriting input system 100, when, for example, an image output from the projector is projected on the writing board 10a and a user writes information such as handwritten characters on the writing board 10a while referring to the projected image, the image can be overwritten to be saved with the information (handwriting data) added to the image. Data files and the like generated in the electronic board 10 can be stored in a storage medium such as USB (registered trademark).

The chassis 120 is supported on the back side by corner reinforcing plates 210a disposed at corners (four corners) and chassis fixing plates 210b disposed at portions other than the corners. The corner reinforcing plates 210a and the chassis fixing plates 210b are an example of a support member of the present disclosure. FIG. 14 illustrates four corner reinforcing plates 210a and five chassis fixing plates 210b. The number of the chassis fixing plates 210b is not restrictive. Each of the corner reinforcing plates 210a is screwed to two (two sides) bezels 110 adjoining at the corner, and each of the chassis fixing plates 210b is screwed to one (one side) bezel 110.

Figure 15:
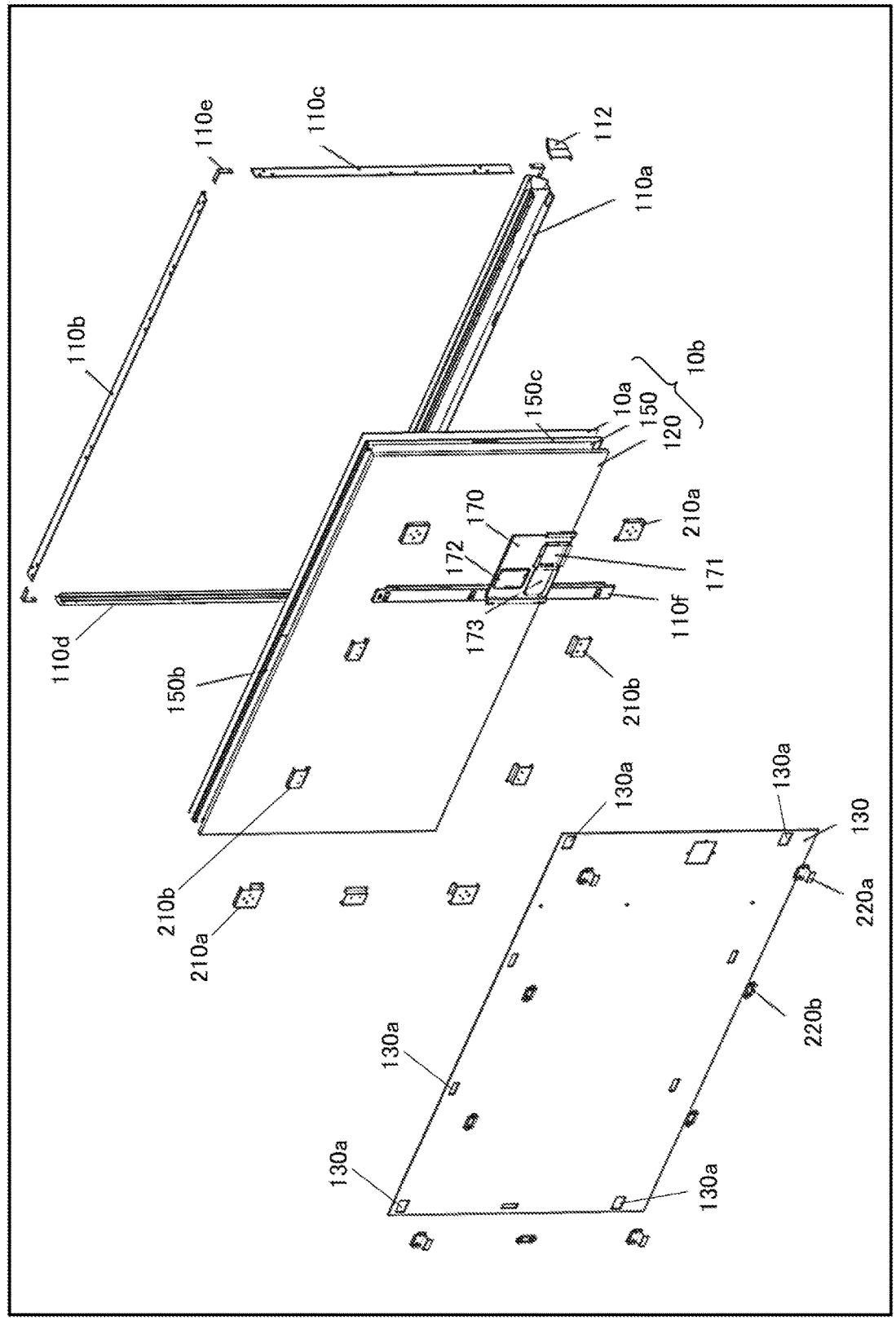
FIG. 15 is an exploded perspective view of an electronic board according to an embodiment of the present disclosure as viewed from the back side.

FIG. 15 is an exploded perspective view of the electronic board 10 as viewed from the back side. The lower bezel 110a, the upper bezel 110b, the right bezel 110c, and the left bezel 110d are connected to one another by corner connecting plates 110e (L-shaped brackets) disposed at corners (four corners). With this configuration, a frame-shaped bezel 110 is formed. The frame-shaped bezel 110 may be integrally molded of a metal material or a resin material.

A board installation plate 220a (an example of a mounting member of the present disclosure) is screwed to the back surface of the corner reinforcing plate 210a, and a back cover pressing plate 220b is screwed to the back surface of the chassis fixing plate 210b. Openings 130a are formed in the back cover 130 at portions overlapping the corner reinforcing plates 210a and portions overlapping the chassis fixing plates 210b. The board installation plate 220a is placed inside the opening 130a from the back side of the back cover 130 and screwed to the corner reinforcing plate 210a. The back cover pressing plate 220b is placed inside the opening 130a from the back side of the back cover 130 and screwed to the chassis fixing plate 210b. The back cover 130 is fixed to be held between the corner reinforcing plate 210a and the board installation plate 220a, and between the chassis fixing plate 210b and the back cover pressing plate 220b.

Figure 16:
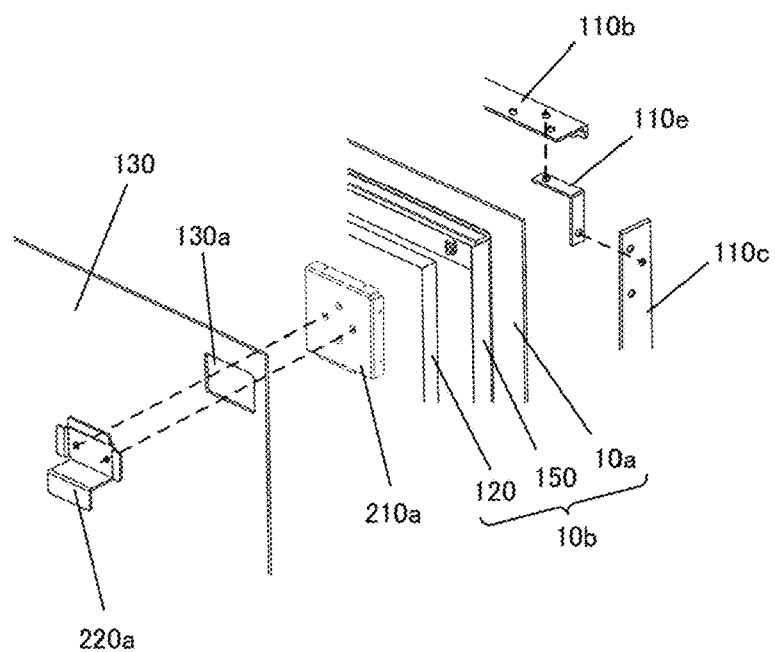
FIG. 16 is an exploded perspective view illustrating a method for fixing an electronic board in an upper corner of an electronic board according to an embodiment of the present disclosure.

FIG. 16 is an exploded perspective view illustrating a method for fixing the electronic board 10 at the corners. The upper bezel 110b and the right bezel 110c are connected to one another by a corner connection plate 110e by using a screw or the like. The writing board 10a, the sensor sheet 150, and the chassis 120 are disposed in this order and are integrally formed by being bonded to each other via an adhesive material (for example, a double-sided tape). The integrated sensor unit 10b is disposed inside the frame-shaped bezel 110.

Figure 17:
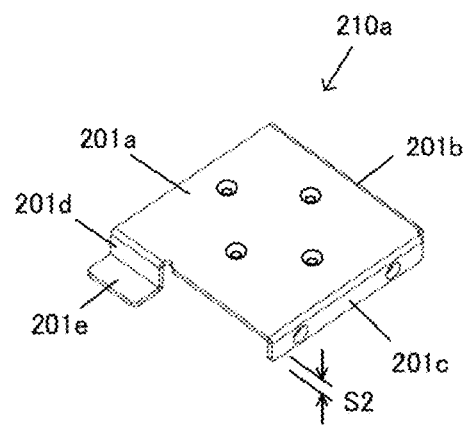
FIG. 17 is a perspective view illustrating a configuration of a corner reinforcing plate of an electronic board according to an embodiment of the present disclosure.

As illustrated in FIG. 16, the corner reinforcing plate 210a is screwed to the upper bezel 110b and the right bezel 110c while pressing the back surface of the chassis 120 of the sensor unit 10b. FIG. 17 is a perspective view illustrating a configuration of the corner reinforcing plate 210a. As illustrated in FIG. 17, the corner reinforcing plate 210a includes an upper surface 201a, a first side surface portion 201b (an example of a first side surface portion of the present disclosure), a second side surface portion 201c (an example of a second side surface portion of the present disclosure), a third side surface portion 201d, and a chassis pressing portion 201e (corresponding to the chassis pressing portion of the present disclosure). The upper surface 201a is parallel to the back surface of the chassis 120, and has four screw holes with which the board installation plate 220a is screwed. The first side surface portion 201b extends from an end of the upper surface 201a to the back surface side of the chassis 120, and has two screw holes for screw fixing to the upper bezel 110b (see FIG. 16). The second side surface portion 201c extends from an end of the upper surface 201a to the back surface side of the chassis 120, and has two screw holes for screw fixing of the right bezel 110c (see FIG. 16). The third side surface portion 201d extends from the end of the upper surface 201a to the back surface side of the chassis 120, and the chassis pressing portion 201e extends parallel to the back surface of the chassis 120 from the end of the third side surface portion 201d. A space S2 is formed in a portion surrounded by the upper surface 201a, the first side surface portion 201b, the second side surface portion 201c, and the third side surface portion 201d. When the first side surface portion 201b and the second side surface portion 201c of the corner reinforcing plate 210a are screwed to the upper bezel 110b and the right bezel 110c, the chassis pressing portion 201e is in contact with the back surface of the chassis 120 and supports the sensor unit 10b from the back side. A space corresponding to the space S2 is formed between the upper surface 201a of the corner reinforcing plate 210a and the chassis 120 (see FIG. 11).

Figure 18:
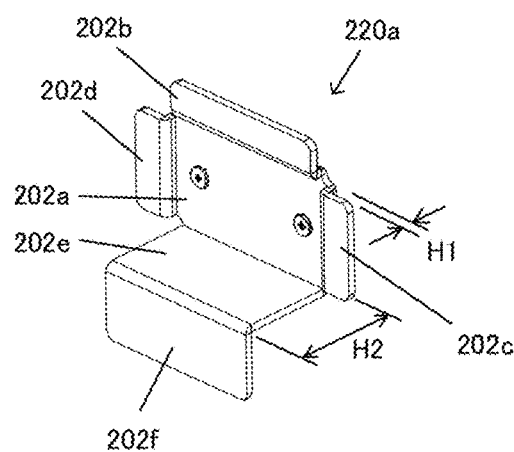
FIG. 18 is a perspective view illustrating a configuration of a board installation board of an electronic board according to an embodiment of the present disclosure.

As illustrated in FIG. 16, the board installation plate 220a is placed into the opening 130a from the back side of the back cover 130 and screwed to the corner reinforcing plate 210a. FIG. 18 is a perspective view illustrating the configuration of the board installation plate 220a. As illustrated in FIG. 18, the board installation plate 220a includes a lower surface 202a, a first back cover pressing portion 202b, a second back cover pressing portion 202c, a third back cover pressing portion 202d, a hook portion 202e, and a fastening portion 202f. The lower surface 202a is parallel to the back surface of the chassis 120, and has two screw holes with which the corner reinforcing plate 210a is screwed. The first back cover pressing portion 202b, the second back cover pressing portion 202c, and the third back cover pressing portion 202d extend by a height H1 from each end of the lower surface 202a in the back direction of the electronic board 10 and extend in the direction parallel to the back surface of the chassis 120. The first back cover pressing portion 202b, the second back cover pressing portion 202c, and the third back cover pressing portion 202d are examples of the back cover pressing portion of the present disclosure.

The hook portion 202e extends by a height H2 from the lower end of the lower surface 202a in the back direction of the electronic board 10, and the fastening portion 202f extends in a direction parallel to the back surface of the chassis 120 (downward) from the end of the hook portion 202e. The height H1 is substantially the same as a thickness of the back cover 130. When the board installation plate 220a is placed inside the opening 130a of the back cover 130 and the lower surface 202a of the board installation plate 220a is screwed to the upper surface 201a of the corner reinforcing plate 210a, the first back cover pressing portion 202b, the second back cover pressing portion 202c, and the third back cover pressing portion 202d are in contact with the back side of the back cover 130 and support the back cover 130 from the back side. The hook portion 202e and the fastening portion 202f are hooked on the frame 51 (see FIG. 2). The hook portion 202e may be provided at the upper end of the lower surface 202a or at the upper end of the first back cover pressing portion 202b, but the hook portion 202e is desirably provided at the lower end of the lower surface 202a from the viewpoint of simplicity in structure and manufacture.

Figure 19A:
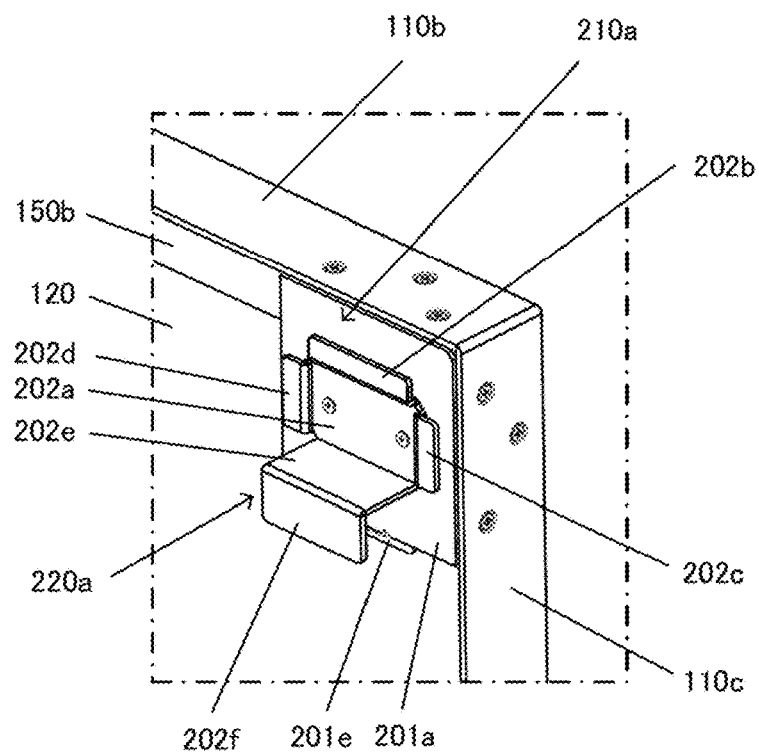
FIG. 19A is a perspective view illustrating a state in which a corner reinforcing plate and a board installation plate are screwed in an upper right corner of an electronic board according to an embodiment of the present disclosure.

FIG. 19A is a perspective view illustrating a state in which the corner reinforcing plate 210a and the board installation plate 220a are screwed in the upper right corner of the electronic board 10. In FIG. 19A, the back cover 130 is omitted. The corner reinforcing plate 210a is screwed to the upper bezel 110b and the right bezel 110c, and the chassis pressing portion 201e presses the chassis 120 from the back side to support the same. The lower surface 202a of the board installation plate 220a is screwed to the upper surface 201a of the corner reinforcing plate 210a, and the first back cover pressing portion 202b, the second back cover pressing portion 202c, and the third back cover pressing portion 202d support the back cover 130 (see FIG. 15) from the back side.

Figure 19B:
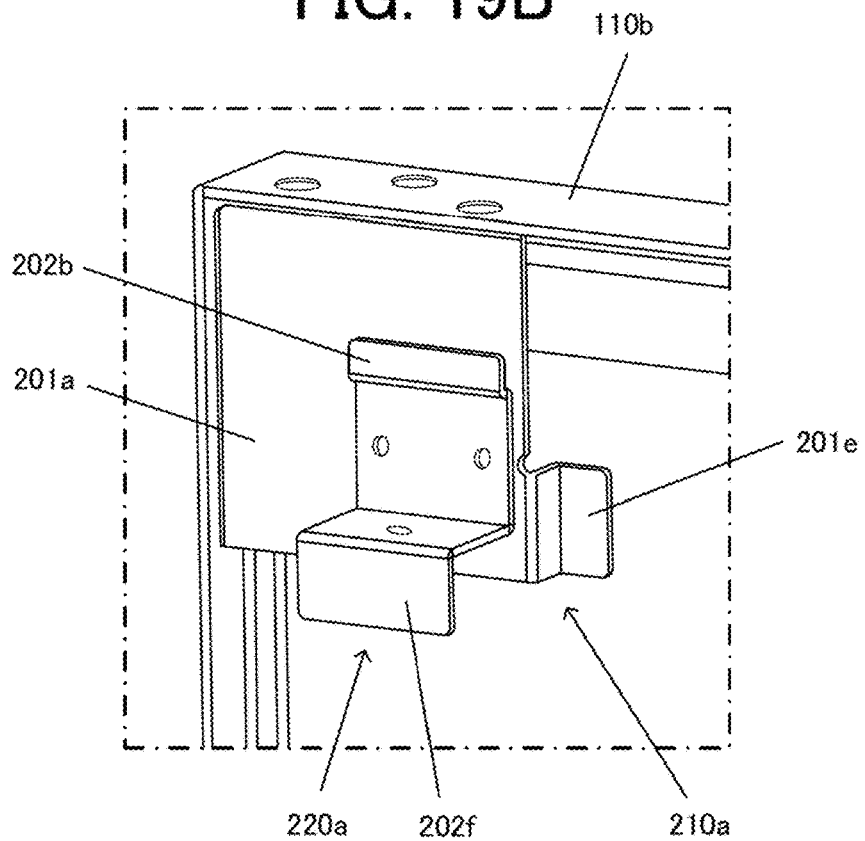
FIG. 19B is a perspective view illustrating a state in which a corner reinforcing plate and a board installation plate are screwed in an upper left corner of an electronic board according to an embodiment of the present disclosure.

Here, as illustrated in FIG. 19B, the second back cover pressing portion 202c and the third back cover pressing portion 202d may be omitted from the board installation plate 220a. FIG. 19B is a perspective view illustrating a state in which the corner reinforcing plate 210a and the board installation plate 220a are screwed in the upper left corner of the electronic board 10. The lower surface 202a of the board installation plate 220a is screwed to the upper surface 201a of the corner reinforcing plate 210a, and the first back cover pressing portion 202b supports the back cover 130 (see FIG. 15) from the back side.

Figure 19C:
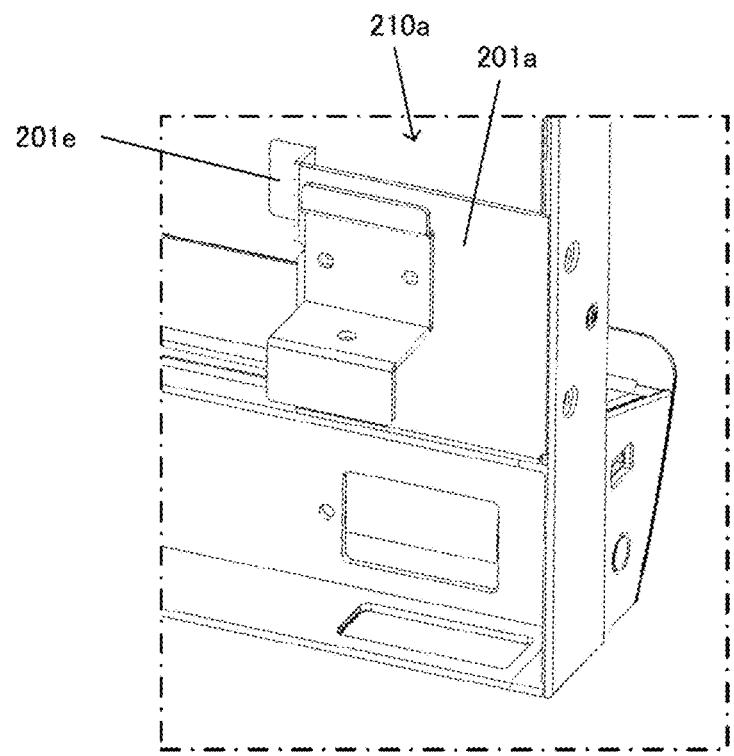
FIG. 19C is a perspective view illustrating a state in which a corner reinforcing plate and a board installation plate are screwed in a lower right corner of an electronic board according to an embodiment of the present disclosure.
Figure 19D:
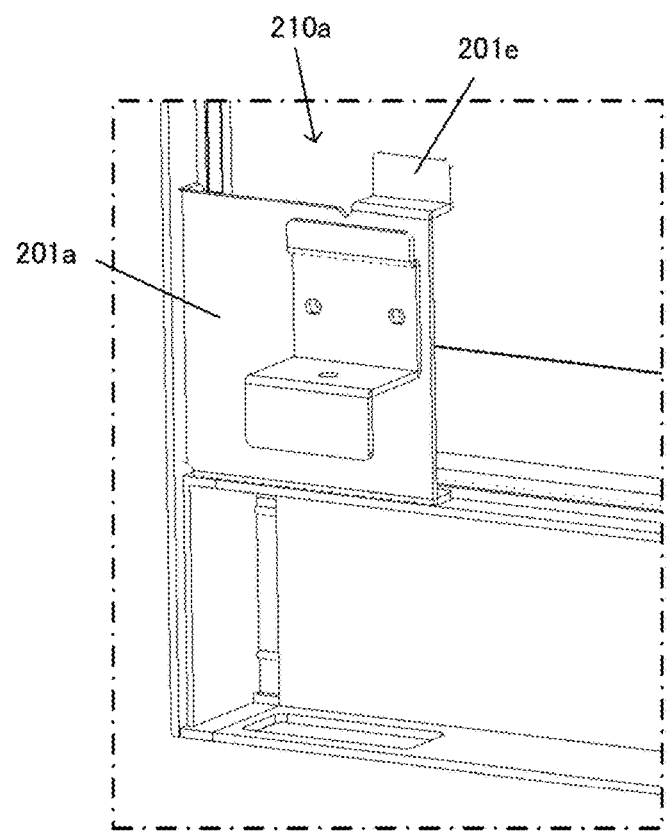
FIG. 19D is a perspective view illustrating a state in which a corner reinforcing plate and a board installation plate are screwed in a lower left corner of an electronic board according to an embodiment of the present disclosure.

The four corner reinforcing plates 210a attached to the four corners are the same in structure. FIG. 19A illustrates a corner reinforcing plate 210a disposed at an upper right corner, FIG. 19B illustrates a corner reinforcing plate 210a disposed at an upper left corner, FIG. 19C illustrates a corner reinforcing plate 210a disposed at a lower right corner, and FIG. 19D illustrates a corner reinforcing plate 210a disposed at a lower left corner. The corner reinforcing plates 210a disposed at the corners are the same in structure. Each of the corner reinforcing plates 210a is rotated corresponding to each corner, and positioned and fixed by using screws.

Figure 20:
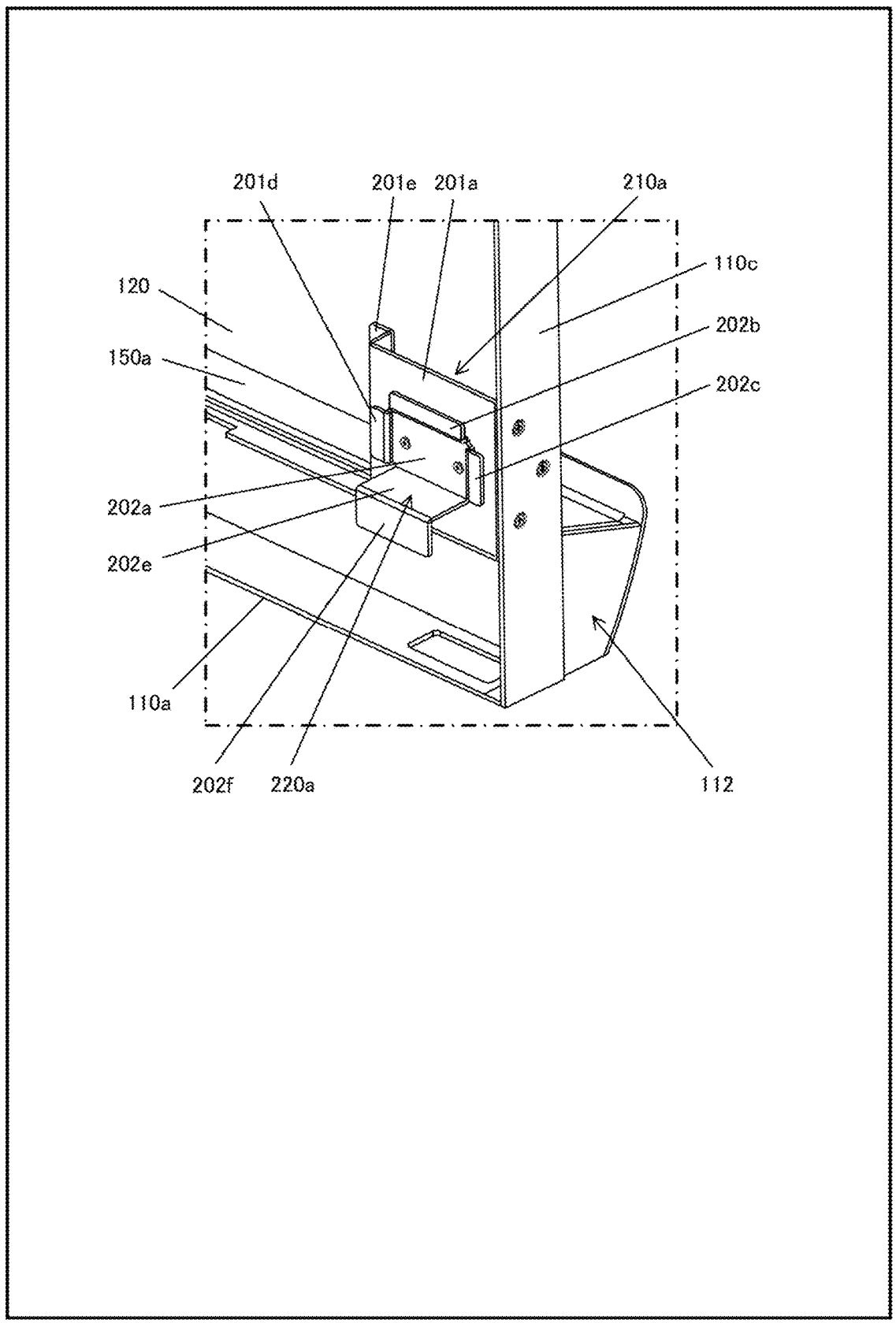
FIG. 20 is a perspective view illustrating a state in which a corner reinforcing plate and a board installation plate are screwed in a lower corner of an electronic board according to an embodiment of the present disclosure.

FIG. 20 is a perspective view illustrating a state in which the corner reinforcing plate 210a and the board installation plate 220a are screwed in the lower corner of the electronic board 10. Here too, the back cover 130 is omitted. The corner reinforcing plate 210a is screwed to the lower bezel 110a and the right bezel 110c, and the chassis pressing portion 201e presses the chassis 120 from the back side to support the same. The lower surface 202a of the board installation plate 220a is screwed to the upper surface 201a of the corner reinforcing plate 210a, and the first back cover pressing portion 202b, the second back cover pressing portion 202c, and the third back cover pressing portion 202d support the back cover 130 (see FIG. 15) from the back side.

Figure 21A:
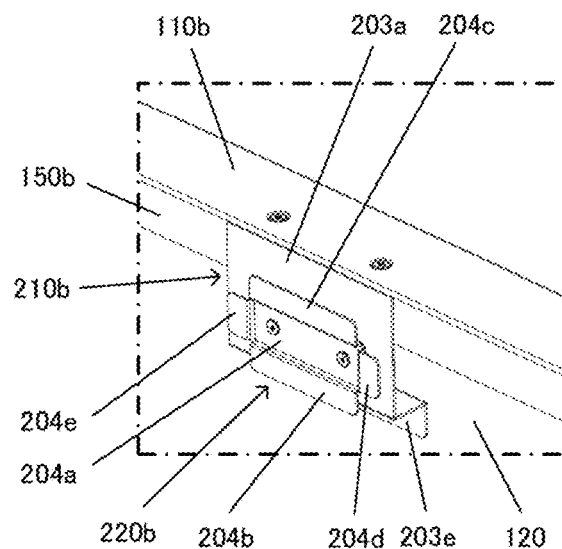
FIG. 21A is a perspective view illustrating a state in which a chassis fixing plate and a back cover pressing plate are screwed in an upper center portion of an electronic board according to an embodiment of the present disclosure.

FIG. 21A is a perspective view illustrating a state in which the chassis fixing plate 210b and the back cover pressing plate 220b are screwed in an upper central portion of the electronic board 10. Here too, the back cover 130 is omitted. The chassis fixing plate 210b is screwed to the upper bezel 110b, and the pressing portion 203e presses the chassis 120 from the back side to support the same. The lower surface 204a of the back cover pressing plate 220b is screwed to the upper surface 203a of the chassis fixing plate 210b, and a first back cover pressing portion 204b, a second back cover pressing portion 204c, a third back cover pressing portion 204d, and a fourth back cover pressing portion 204e support the back cover 130 (see FIG. 15) from the back side.

Figure 21B:
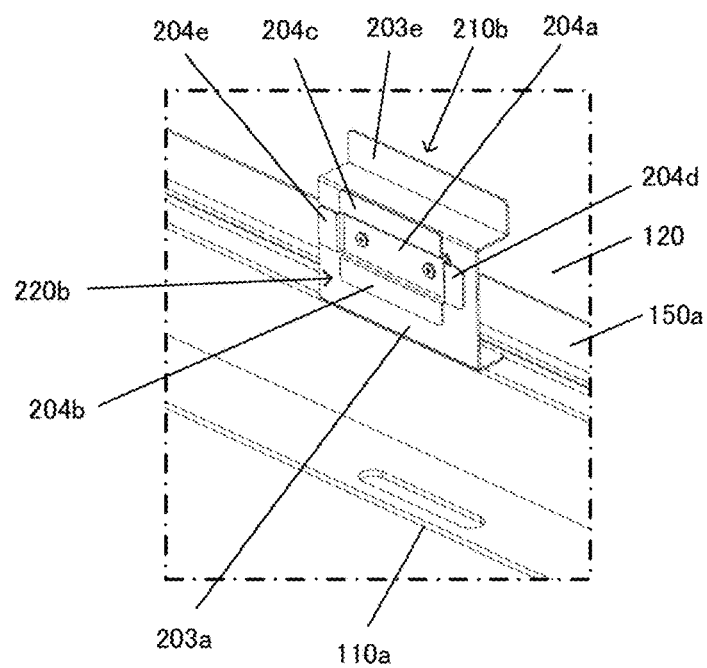
FIG. 21B is a perspective view illustrating a state in which a chassis fixing plate and a back cover pressing plate are screwed in a lower center portion of an electronic board according to an embodiment of the present disclosure.

FIG. 21B is a perspective view illustrating a state in which the chassis fixing plate 210b and the back cover pressing plate 220b are screwed in a lower central portion of the electronic board 10. Here too, the back cover 130 is omitted. The chassis fixing plate 210b is screwed to the lower bezel 110a, and the pressing portion 203e presses and supports the chassis 120 from the back side. The lower surface 204a of the back cover pressing plate 220b is screwed to the upper surface 203a of the chassis fixing plate 210b, and the first back cover pressing portion 204b, the second back cover pressing portion 204c, the third back cover pressing portion 204d, and the fourth back cover pressing portion 204e support the back cover 130 (see FIG. 15) from the back side.

Figure 22:
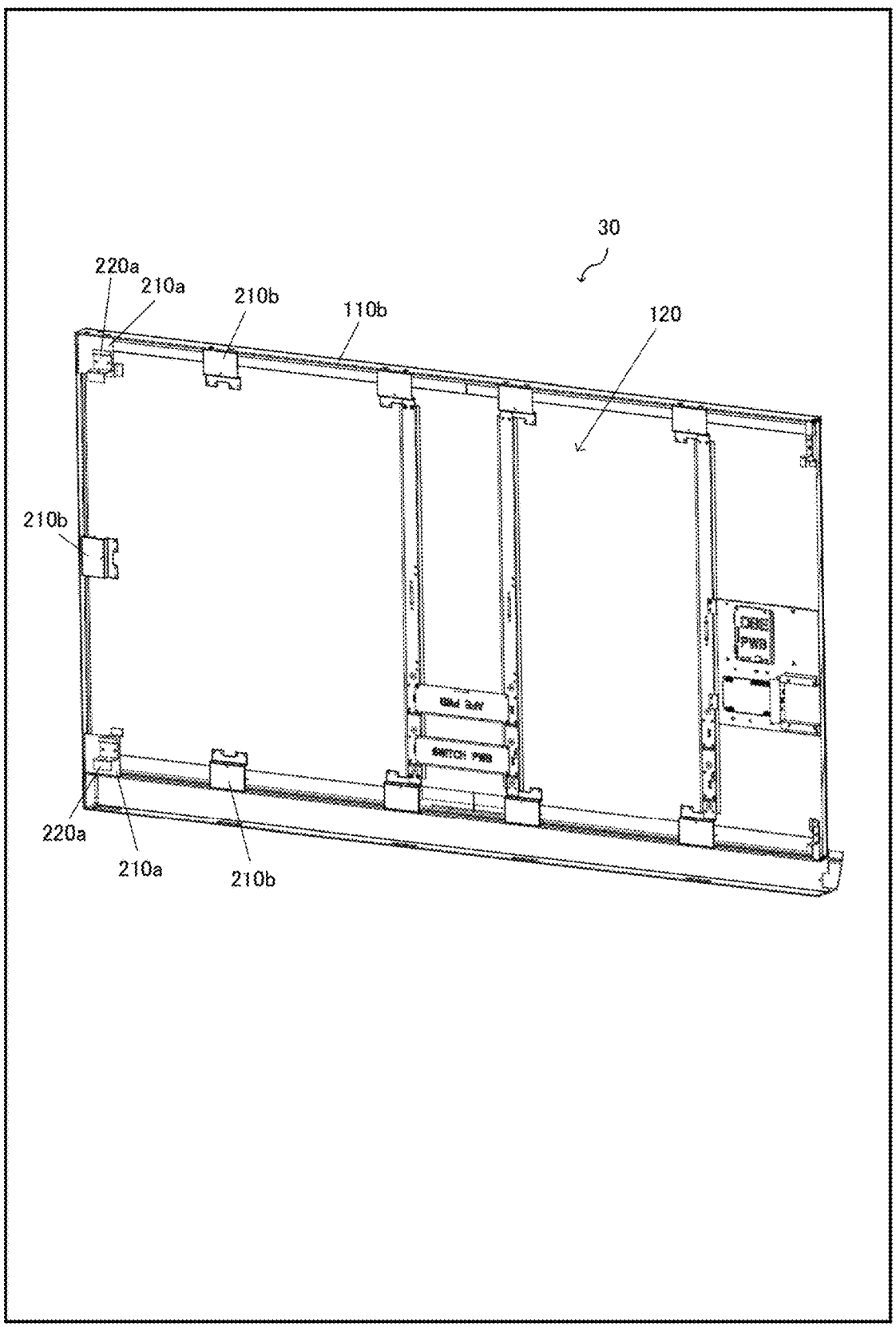
FIG. 22 is a perspective view of an electronic board according to an embodiment of the present disclosure as viewed from the back side.

The back cover pressing plate 220b may be omitted. In this case, as illustrated in FIG. 22, the back cover 130 is supported by the board installation plate 220a at the corners (four corners) and fixed to the chassis fixing plate 210b by using screws or the like at the central portion. In a case where the back cover pressing plate 220b is omitted, the number of parts of the electronic board 10 can be reduced. Further, the processing of the opening 130a of the back cover 130 is not necessary. The electronic board 10 is not limited to the configuration illustrated in FIG. 14, but may be the configuration illustrated in FIG. 22.

Method 1 for Fixing Sensor Substrate

A first fixing method of the sensor substrates 150a, 150b, and 150c will be described. The sensor substrates 150a and 150b disposed on the longitudinal side (upper side and lower side) of the electronic board 10 are disposed on the back side of the chassis 120, and the sensor substrate 150c disposed on the lateral side (for example, the right side) of the electronic board 10 is disposed on the side surface of the chassis 120.

Specifically, as illustrated in FIG. 9, the sensor substrate 150a is disposed on the back surface of the chassis 120 at the lower end of the chassis 120 with the sensor sheet 150 being rotated by 180 degrees so that the sensor sheet 150 covers the lower end (lower surface) of the chassis 120. A buffer member 160a is disposed between the sensor substrate 150a disposed on the back surface of the chassis 120 and the corner reinforcing plate 210a supporting the back surface of the chassis 120 (space S2 (see FIG. 10)). Specifically, the buffer member 160a is disposed in a space between the upper surface 201a of the corner reinforcing plate 210a and the back surface of the chassis 120 (the space S2 in FIG. 10) formed when the corner reinforcing plate 210a is screwed to the lower bezel 110a and the right bezel 110c. The buffer member 160a touches and presses the upper surface of the sensor substrate 150a. The chassis pressing portion 201e of the corner reinforcing plate 210a presses the chassis 120 from the back side in a region in which the sensor substrate 150a is not disposed in the back surface of the chassis 120. Therefore, the sensor substrate 150a is supported with being pressed toward the front by the buffer member 160a. Further, the sensor unit 10b is held between the corner reinforcing plate 210a and the bezel 110.

As illustrated in FIG. 9, as in the sensor substrate 150a, the sensor substrate 150b is disposed on the back surface of the chassis 120 at the upper end of the chassis 120 with the sensor sheet 150 being rotated by 180 degrees so that the sensor sheet 150 covers the upper end (upper surface) of the chassis 120. As illustrated in FIG. 12, a buffer member 160b is disposed between the sensor substrate 150b disposed on the back surface of the chassis 120 and the corner reinforcing plate 210a supporting the back surface of the chassis 120 (space S2 (see FIG. 11)). Specifically, the buffer member 160b is disposed in a space between the upper surface 201a of the corner reinforcing plate 210a and the back surface of the chassis 120 (the space S2 in FIG. 11) formed when the corner reinforcing plate 210a is screwed to the upper bezel 110b and the right bezel 110c. The buffer member 160b touches and presses the upper surface of the sensor substrate 150b. The chassis pressing portion 201e of the corner reinforcing plate 210a presses the chassis 120 from the back side in a region of the back surface of the chassis 120 in which the sensor substrate 150b is not provided. Therefore, the sensor substrate 150b is supported with being pressed toward the front by the buffer member 160b. Further, the sensor unit 10b is held between the corner reinforcing plate 210a and the bezel 110. The buffer members 160a and 160b may be elastic members such as rubber, but are desirably conductive members such as gaskets or ground springs. By using conductive members as the buffer members 160a and 160b, it is possible to strengthen the grounding of the sensor substrates 150a and 150b, and to provide effective countermeasures against the Electro Magnetic Interference (EMI).

As illustrated in FIG. 13, similarly in portions other than the corners (for example, the center), the buffer member 160b touches and presses the upper surface of the sensor substrate 150b. The pressing portion 203e of the chassis fixing plate 210b presses the chassis 120 from the back side in a region of the back surface of the chassis 120 in which the sensor substrate 150b is not provided. Therefore, the sensor substrate 150b is supported in a state of being pressed toward the front by the buffer member 160b. The sensor unit 10b is held between the chassis fixing plate 210b and the bezel 110.

As illustrated in FIG. 8, the sensor substrate 150c is disposed on the side surface of the chassis 120 with the sensor sheet 150 being bent at the right end (right side surface) of the chassis 120 and rotated 90 degrees. A buffer member 161c is disposed between the sensor substrate 150c disposed on the side of the chassis 120 and the right bezel 110c. Therefore, the sensor substrate 150c is supported with being pressed toward the side by the buffer member 161c. The buffer member 161c may be an elastic member such as rubber as the buffer members 160a and 160b, but is desirably a conductive member such as a gasket or a ground spring. By using a conductive member as the buffer member 161c, it is possible to strengthen the grounding of the sensor substrate 150c, and to provide effective countermeasures against EMI.

According to the above-described configuration, the sensor substrates 150a and 150b are supported by the buffer members 160a and 160b disposed in the space (space S2) formed between the chassis 120 and the corner reinforcing plate 210a and the chassis fixing plate 210b on the back surface of the chassis 120. Further, the sensor substrate 150c is supported by the buffer member 161c disposed in the space formed between the chassis 120 and the bezel 110 on the side surface of the chassis 120. As described above, the sensor substrates 150a and 150b disposed on the long side of the electronic board 10 and the sensor substrate 150c disposed on the short side of the electronic board 10 are at different positions (back surface, side surface) with respect to the chassis 120. Further, the sensor substrates 150a, 150b, and 150c are not fixed to the chassis 120 and other components by using screws or the like, and are movably supported (held) by the buffer members 160a, 160b, and 161c. For this reason, if deformation such as distortion occurs in the sensor unit 10b due to, for example, an environmental change, the sensor substrates 150a, 150b, and 150c hardly affected by that deformation. Therefore, it is possible to prevent defects such as damage and false detection due to deformation of the sensor substrates caused from deformation of 150a, 150b, and 150c.

Here, in the above-described configuration, when the sensor substrates 150a, 150b, and 150c are disposed on the back surface or the side surface of the chassis 120, the sensor sheet 150 is partially bent. In particular, when the sensor substrates 150a and 150b are disposed on the back surface of the chassis 120, the sensor sheet 150 is partially bent 180 degrees. For this reason, there is a possibility that damage may be caused in the portion in which the sensor sheet 150 is bent (bent portion). Therefore, this embodiment further includes a structure for preventing the sensor sheet 150 from being damaged.

Specifically, as illustrated in FIG. 9, a space is formed between the lower end (lower surface) of the chassis 120 and the lower bezel 110a, and a flexing portion 151a is formed in the bent portion of the sensor sheet 150 in the space. Similarly, a space is formed between the upper end (upper surface) of the chassis 120 and the upper bezel 110b, and a flexing portion 151b is formed in a bent portion of the sensor sheet 150 in the space. With this configuration, since the flexing portion can be provided in the bent portion of the sensor sheet 150, when the sensor unit 10b is deformed, for example, the amount of deformation according to deformation can be absorbed by the flexing portion 151b. Therefore, damage to the sensor sheet 150 can be prevented. In order to prevent the bent portion of the sensor sheet 150 from being in contact with the lower bezel 110a and the upper bezel 110b, it is desirable that the buffer members 161a and 161b (see FIG. 9) are disposed between the bent portion of the sensor sheet 150 and the lower bezel 110a and the upper bezel 110b at the lower end and the upper end of the chassis 120.

Note that the sensor substrates 150a and 150b may be disposed on the side surface of the chassis 120 at the lower end of the chassis 120 with the sensor sheet 150 being bent at the lower end of the chassis 120 and rotated 90 degrees, and the sensor substrate 150c may be disposed on the back surface of the chassis 120 at the right end (right side surface) of the chassis 120 with the sensor sheet 150 being rotated 180 degrees so that the sensor sheet 150 covers the right end (right side surface) of the chassis 120.

Method 2 for Fixing Sensor Substrate

A second fixing method of the sensor substrates 150a, 150b, and 150c will be described with reference to FIGS. 10 and 11. The configuration in which the sensor substrates 150a and 150b are disposed on the back surface of the chassis 120 and supported by the buffer members 160a and 160b, and the configuration in which the sensor substrate 150c is disposed on the side surface of the chassis 120 and supported by the buffer member 161c are the same as that of the first fixing method.

As illustrated in FIG. 10, the writing board 10a, the sensor sheet 150, and the chassis 120 forming the sensor unit 10b are bonded and fixed together such that the lower end of the chassis 120 is positioned above the lower end of the writing board 10a. When the thus integrated sensor unit 10b is attached to the lower bezel 110a, the lower end of the writing board 10a is placed on and supported by a mounting portion 110h of the lower bezel 110a. That is, the sensor unit 10b is supported with the lower end of the writing board 10a being mounted on the mounting portion 110h of the lower bezel 110a. Therefore, the load (self weight) of the sensor unit 10b is applied to the mounting portion 110h. Therefore, a space S1 is formed between the lower end of the chassis 120 and the lower bezel 110a. In the bent portion of the sensor sheet 150, a flexing portion 151a corresponding to the space S1 is formed. The flexing portion 151a is bent, for example, with a predetermined radius of curvature according to the space S1.

The height of the mounting portion 110h may be higher than a portion of the lower bezel 110a facing the lower end of the chassis 120. In this case, the sensor unit 10b may be bonded and fixed such that the lower end of the chassis 120 and the lower end of the writing board 10a are at the same height (on the same surface). Also, in this configuration, the space S1 can be formed between the lower end of the chassis 120 and the lower bezel 110a.

Further, as illustrated in FIG. 11, a space (space S3) is formed between the upper end of the chassis 120 and the upper bezel 110b. In the bent portion of the sensor sheet 150, the flexing portion 151b bent at a predetermined radius of curvature according to the space 83 is formed. The sizes of the spaces S1 and S3 are set to optimum values by appropriately adjusting the length of the chassis 120 in the vertical direction.

According to the second fixing method, the curve of the bent portion of the sensor sheet 150 can be made gentle (the radius of curvature can be increased). Therefore, damage to the sensor sheet 150 can be reliably prevented.

Configuration of Chassis

The sensor sheet 150 is formed in a film shape and has flexibility. The writing board 10a is formed of a resin material having a thickness of about several mm to reduce the weight of the entire electronic board 10. Therefore, the writing board 10a is easily bent. The sensor sheet 150 and the writing board 10a are attached to the chassis 120 in order to suppress the bending of the sensor sheet 150 and the writing board 10a. By integrally forming the writing board 10a, the sensor sheet 150, and the chassis 120, the sensor unit 10b has a structure in which bending does not easily occur.

The chassis 120 also has a function of preventing a decrease in detection accuracy of position coordinates due to the influence of noise. Specifically, the sensor sheet 150 is made of copper wiring with low wiring resistance, and is susceptible to noise. Especially when a metal material such as metal parts (the corner reinforcing plate 210a and the chassis fixing plate 210b) for fixing the sensor unit 10b is located close to the sensor sheet 150, the sensor sheet 150 is susceptible to noise from the metal material. Therefore, it is desirable to set a thickness t1 (see FIG. 11) of the chassis 120 to a thickness that is less susceptible to noise, for example, about 15 mm to 20 mm. When thickness reduction is also considered, it is more desirable to set the thickness t1 to about 15 mm.

Configuration of Power Supply and Connection Terminal

Figure 24:
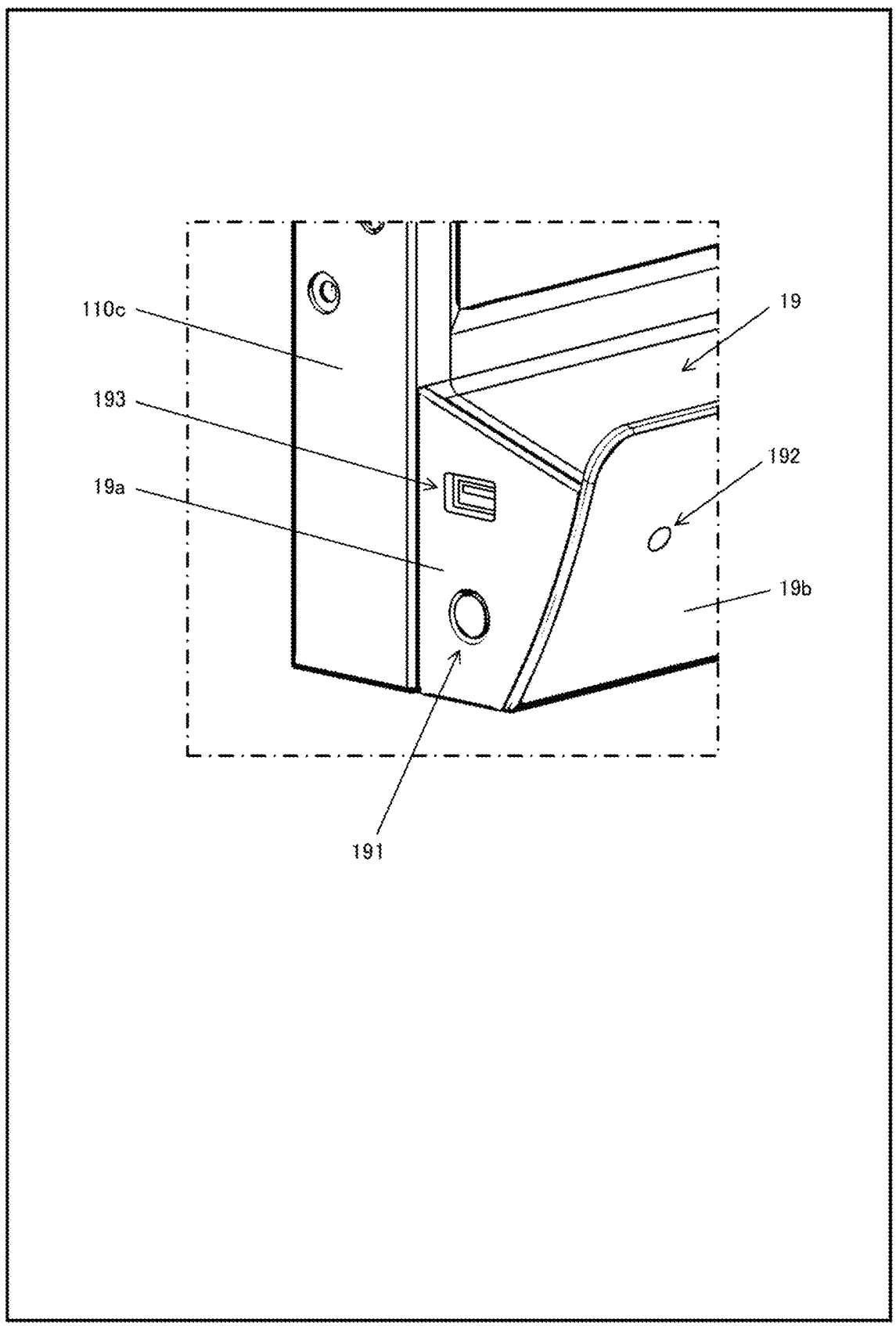
FIG. 24 is a perspective view illustrating a configuration of a pen holder including a power supply and a connection terminal of an electronic board according to an embodiment of the present disclosure.

As illustrated in FIG. 24, the electronic board 10 further includes: a power button 191 for turning on and off the electronic board 10; an LED 192 (indicator) (an example of a notification section according to the present disclosure) for notifying (displaying) the state of the power (ON or OFF) of the electronic board 10 to the outside; and a connection terminal 193 (interface terminal) for connecting a storage medium that stores data files generated in the electronic board 10, information input by using a human finger or the pen 30, and the like. The power button 191 and the connection terminal 193 are examples of the operation section of the present disclosure. The operation section of the present disclosure may be, for example, an adjustment section for adjusting the display state (brightness, luminance, and the like) of the electronic board 10, an input terminal for inputting an external signal, an output terminal for outputting an internal signal, and a function button for executing various functions of pieces of software installed in the electronic board 10.

The power of the electronic board 10 is supplied, for example, via a power cable (not illustrated). The user can turn on the electronic board 10 by pressing the power button 191. When the user presses the power button 191 while the electronic board 10 is ON, the electronic board 10 turns OFF. The LED 192 turns on, for example, when the electronic board 10 is ON, and turns off when the electronic board 10 is OFF.

The storage medium is, for example, a USB flash drive, an SD card. CD-ROM, and DVD-ROM. When the storage medium is a USB flash drive, the connection terminal 193 is formed by a USB terminal. When the storage medium is an SD card, the connection terminal 193 is formed by an SD card slot. When the storage medium is CD-ROM or DVD-ROM, the connection terminal 193 is formed by, for example, a USB terminal, and is connected to an external drive of CD-ROM or DVD-ROM via a USB cable. The connection terminal 193 in FIG. 24 represents a USB terminal. The connection terminal 193 may be a terminal to which a device (a wireless or wired communication device, a communication cable or the like) for transmitting the data file, the input information and the like to an external device is connected.

The power button 191 and the connection terminal 193 are provided on a side surface 19a of the pen holder 19, and the LED 192 is provided on a front surface 19b of the pen holder 19.

Figure 25:
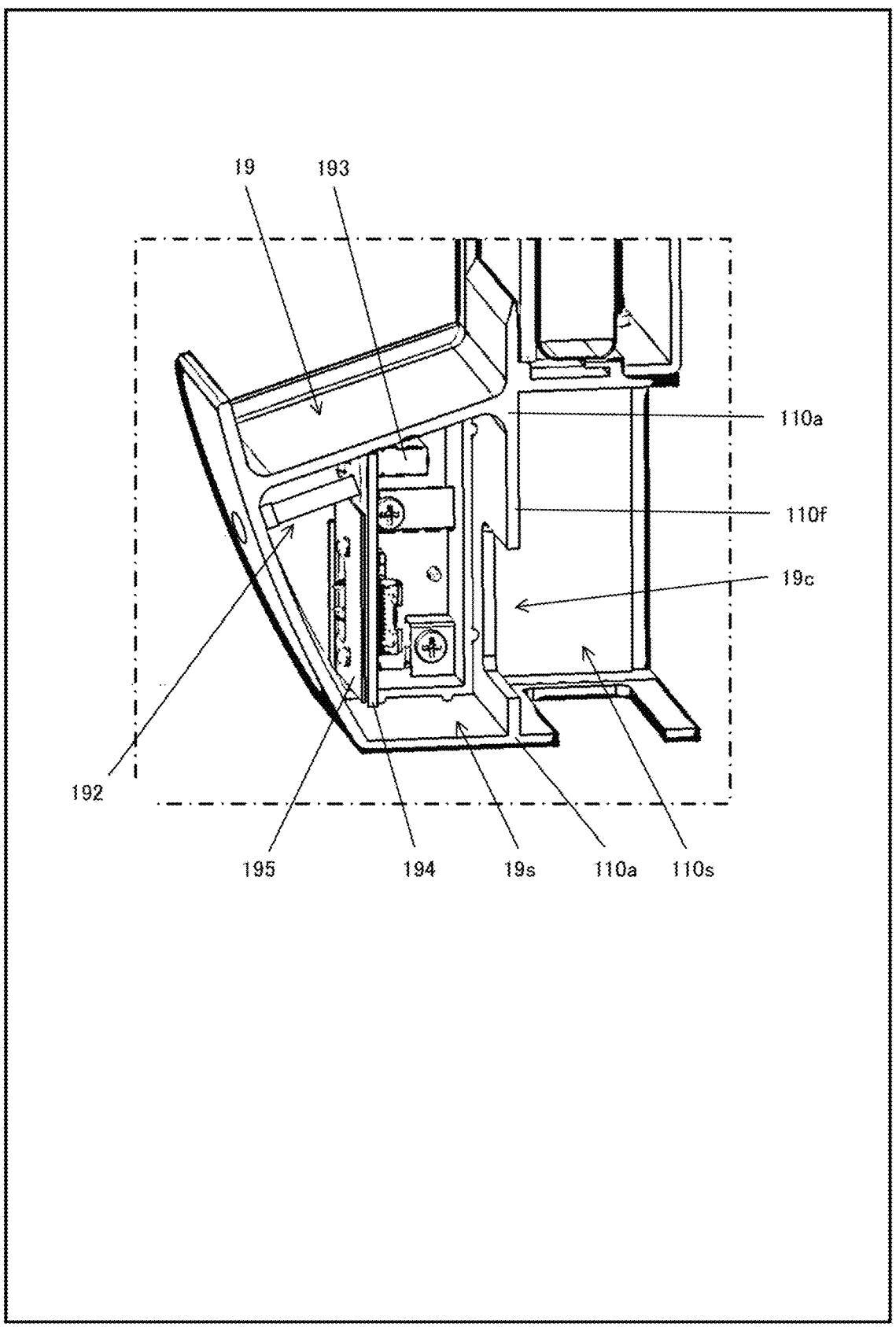
FIG. 25 is a perspective view of a cross-section illustrating an internal configuration of a pen holder including a power supply and a connection terminal of an electronic board according to an embodiment of the present disclosure.

As illustrated in FIG. 25, components forming the power button 191, the LED 192, and the connection terminal 193 are accommodated in a space 19s inside the lower bezel 110a, which is an internal space below (on the back side of) the pen holder 19. A circuit board 194 on which circuits that supply various signals to the power button 191, the LED 192, and the connection terminal 193 are mounted is disposed in the space 19s. The circuit board 194 is attached to a mounting bracket 195 screwed to a housing of the pen holder 19. The side surface 19a of the pen holder 19 may be formed by a cap (lid). The power button 191, the LED 192, the connection terminal 193, the circuit board 194, and the mounting bracket 195 may be attached to the cap. In this case, the cap is calked into the side surface of the pen holder 19 to be fixed thereto.

Figure 26:
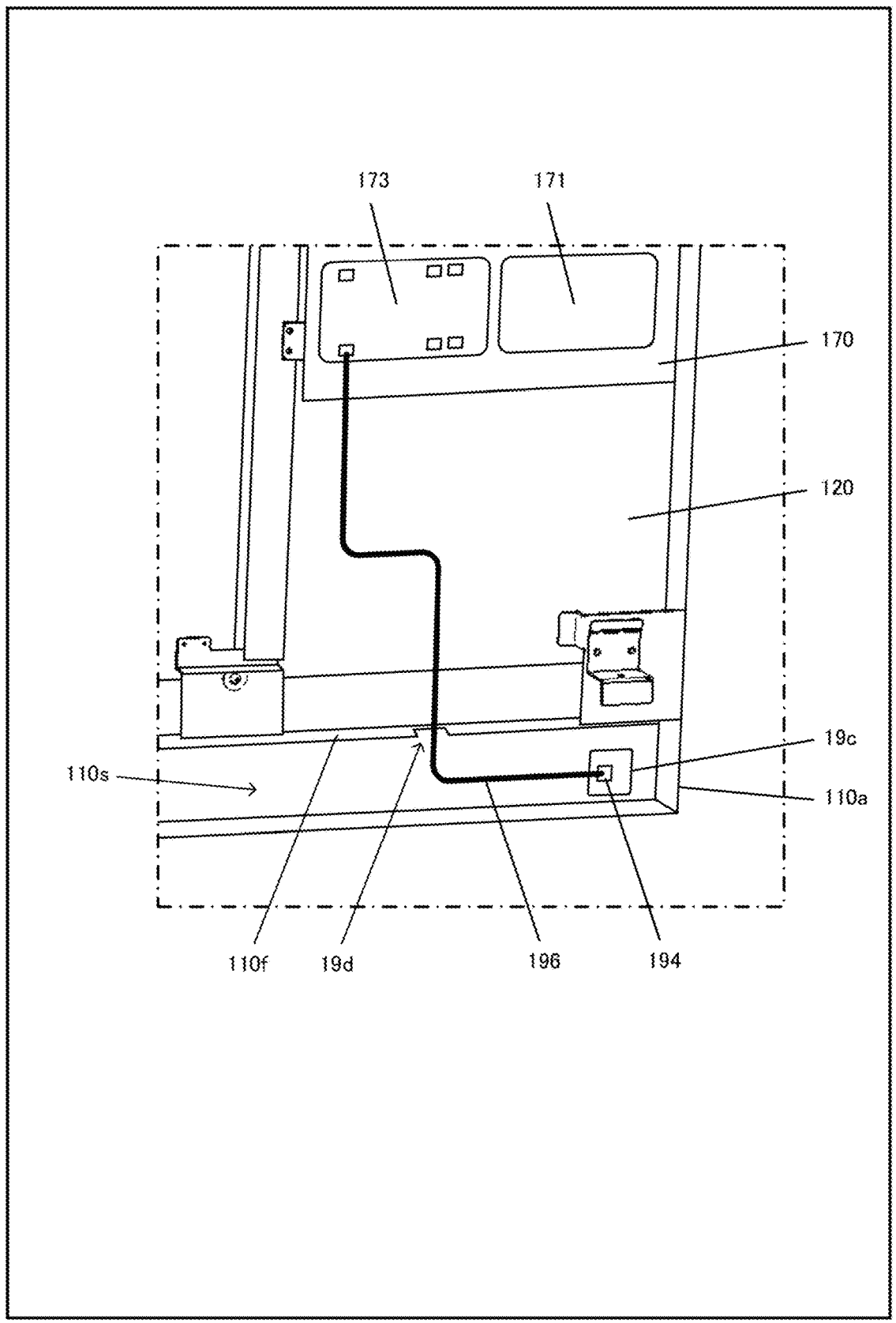
FIG. 26 is a perspective view of a portion including a power supply and a connection terminal of an electronic board according to an embodiment of the present disclosure as viewed from the back side.

An opening 19c (see FIGS. 25 and 26) is formed in the lower bezel 110a. As illustrated in FIG. 26, a cable 196 connected to the circuit board 194 is introduced in a space 110s in the lower bezel 110a through the opening 19c. Also, the cable 196 is introduced to the back side of the chassis 120 from a notch 19d formed in a partition wall 110f of the lower bezel 110a, and is connected to the interface substrate 173 through the back surface of the chassis 120.

In the conventional electronic boards, a power supply, a connection terminal and the like are provided on the front side of the electronic board (for example, side of a writing board). In this conventional configuration, a frame of the electronic board is thick. By contrast, in the electronic board 10 according to this embodiment, the power button 191 and the connection terminal 193 are provided on the side surface 19a of the pen holder 19. Therefore, the frame of the electronic board 10 can be narrowed. When a commercially available pen 30 is used, foreign matter such as debris generated from the pen 30 may be accumulated in the pen holder 19. Since the power button 191 and the connection terminal 193 are provided on the side surface 19a of the pen holder 19, the accumulated foreign matter can be prevented from being adhering to the power button 191 and the connection terminal 193.

Further, in the electronic board 10 according to this embodiment, the partition wall 110f (see FIGS. 25 and 26) is provided between the internal space (space 19s) in which the circuit board 194 of the power button 191, the LED 192, and the connection terminal 193 is disposed, and the space in which the sensor sheet 150 and various circuit boards for detecting the contact position are disposed. With this configuration, the influence of noise on the sensor sheet 150 and the various circuit boards from the power button 191, the LED 192 and the connection terminal 193 can be reduced. The circuit board 194 of the power button 191, the LED 192, and the connection terminal 193 may be disposed in the space 19s or may be disposed in the space 110s (see FIG. 26).

Moreover, the power button 191 and the connection terminal 193 may be provided on the front surface 19b (see FIG. 24) of the pen holder 19 in the same manner as the case of the LED 192. When the pen holder 19 is formed of aluminum, and the side surface 19a is formed of resin and is calked into pen holder 19, the power button 191 and the connection terminal 193 are desirably provided on the side surface 19a from the viewpoint of ease assembly and safety.

Configuration of Sensor Substrate

Copper wires (sensor wires 152) having low wiring resistance are disposed on the sensor substrates 150a, 150b, and 150c. Therefore, the sensor substrates 150a, 150b, and 150c are susceptible to noise.

Figure 27A:
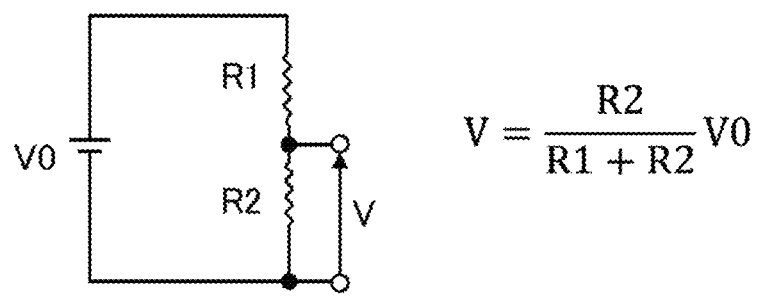
FIG. 27A is a circuit diagram of a typical series resistance circuit.
Figure 27B:
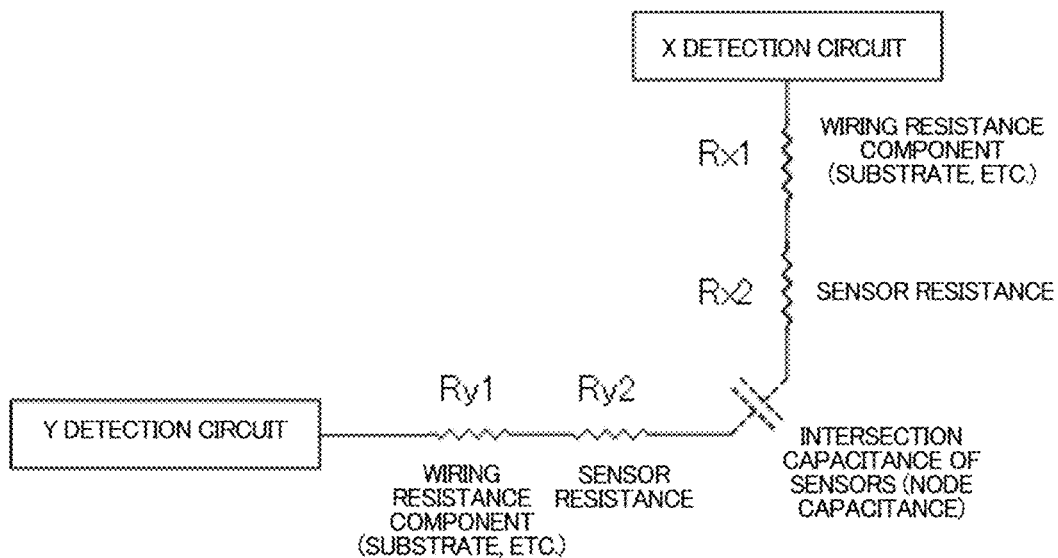
FIG. 27B is a diagram in which the series resistance circuit in FIG. 27A is replaced with a touch sensor circuit.

Here, the influence of the noise on the sensor wires 152 will be discussed. FIG. 27A is a circuit diagram of a typical series resistance circuit. FIG. 27B is a diagram in which the series resistance circuit in FIG. 27A is replaced with a touch sensor circuit. The X detection circuit and the Y detection circuit sequentially transmit and detect a touch detection signal. These circuits are closed in operation.

The voltage across resistance R2 is calculated by a voltage dividing ratio of resistance. Here, when resistance R1 is wiring resistance to a touch sensor of a touch panel circuit, and the resistance R2 is a resistance component of the touch sensor itself. The sensor wires (copper wires) with a resistance value of about $\frac{1}{100}$ compared to a conventional metal mesh sensors have greater voltage contribution of the wiring resistance (that is, the voltage across the resistance R1 is high). When a power supply V0 is a noise source, the influence of the noise on the resistance R1, that is, wiring resistance to the touch sensor (wiring in the substrate, and the like)) is significantly large. For this reason, reduction of noise against the sensor wires disposed on the sensor substrate is important.

The sensor substrates 150a, 150b, and 150c according to an embodiment of the present disclosure have a structure that is less susceptible to noise. Since the sensor substrates 150a, 150b, and 150c are the same in configuration, the sensor substrate 150a will be described as an example below.

FIGS. 28A, 28B, 29A, and 29B illustrate the configuration of the sensor substrate 150a. The sensor substrate 150a has a four-layer structure. A first layer is illustrated in FIG. 28A. Terminals 155 to which electrode wires (X parallel electrode wires 13x) are connected and connector connecting portions 156 are formed on a base material 154. A shield layer 157x (an example of a first shield layer of the present disclosure) made of a copper material is formed in a solid state on the entire surface (back surface; corresponding to a first surface of the present disclosure) of the base material 154.

A second layer is illustrated in FIG. 28B. A pattern of sensor wires 152x (an example of a first sensor wire of the present disclosure) is formed on a front surface (corresponding to a second surface of the present disclosure) of the base material 154. The sensor wires 152x are electrically connected to the odd-numbered terminals 155x.

A third layer is illustrated in FIG. 29A. A pattern of sensor wires 152y (an example of a second sensor wire of the present disclosure) is formed on the sensor wires 152x via an insulating film on the front surface of the base material 154. The sensor wires 152y are electrically connected to the even-numbered terminals 155y.

A fourth layer is illustrated in FIG. 29B. A shield layer 157y (an example of a second shield layer of the present disclosure) made of a copper material is formed in a solid state on the entire surface of the sensor wires 152y on the front surface of the base material 154.

Front and back surfaces of the four-layer sensor substrate 150a are covered with the shield layers 157x and 157y. For this reason, the influence of noise on the sensor wires 152x and 152y of the sensor substrate 150a can be reduced. Therefore, noise in the electronic board 10 can be reduced by a simple configuration, and the cost for the noise reduction can be reduced. Thus, it is possible to implement an electronic board 10 with a simple configuration at a low cost.

Further, in the sensor substrate 150a, since adjacent sensor wires 152x and 152y are arranged in different layers (second and third layers), wiring defects due to contact between adjacent sensor wires 152x and 152y can be avoided. Furthermore, since the sensor wires 152x and 152y are alternately arranged evenly, mutual capacitive coupling between adjacent sensor wires 152x and 152y (adjacent channels) can be made uniform. In this embodiment, in the second layer and the third layer, the sensor wires 152x and 152y are alternately arranged (every other line), but the present disclosure is not limited to the same. The sensor wires 152x and 152y may be arranged in every plural lines (for example, every two lines).

Here, the shield layers (157x and 157y) may be connected to ground of a circuit or to a reference potential (ground) of a drive circuit of the touch panel. When a configuration in which the shield layers 157x and 157y are connected to the reference potential is employed, a problem that parasitic capacitance increases, that is, a signal level of a signal line located between large-area ground layers attenuates due to capacitively coupling with the ground layers (virtual capacitor formation) can occur. As a solution to this problem, for example, a dummy signal (a reference signal having the same frequency and the same phase as that of a touch panel drive signal) is applied to the shield layer to cancel a potential difference with the signal line (the sensor wires 152x and 152y), whereby cancelling the occurrence of the parasitic capacitance while maintaining the shielding effect. If the attenuation of the signal level does not affect the touch detection accuracy in actual use, the above method does not necessarily have to be employed.

Method for Installing Electronic Board

Figure 23:
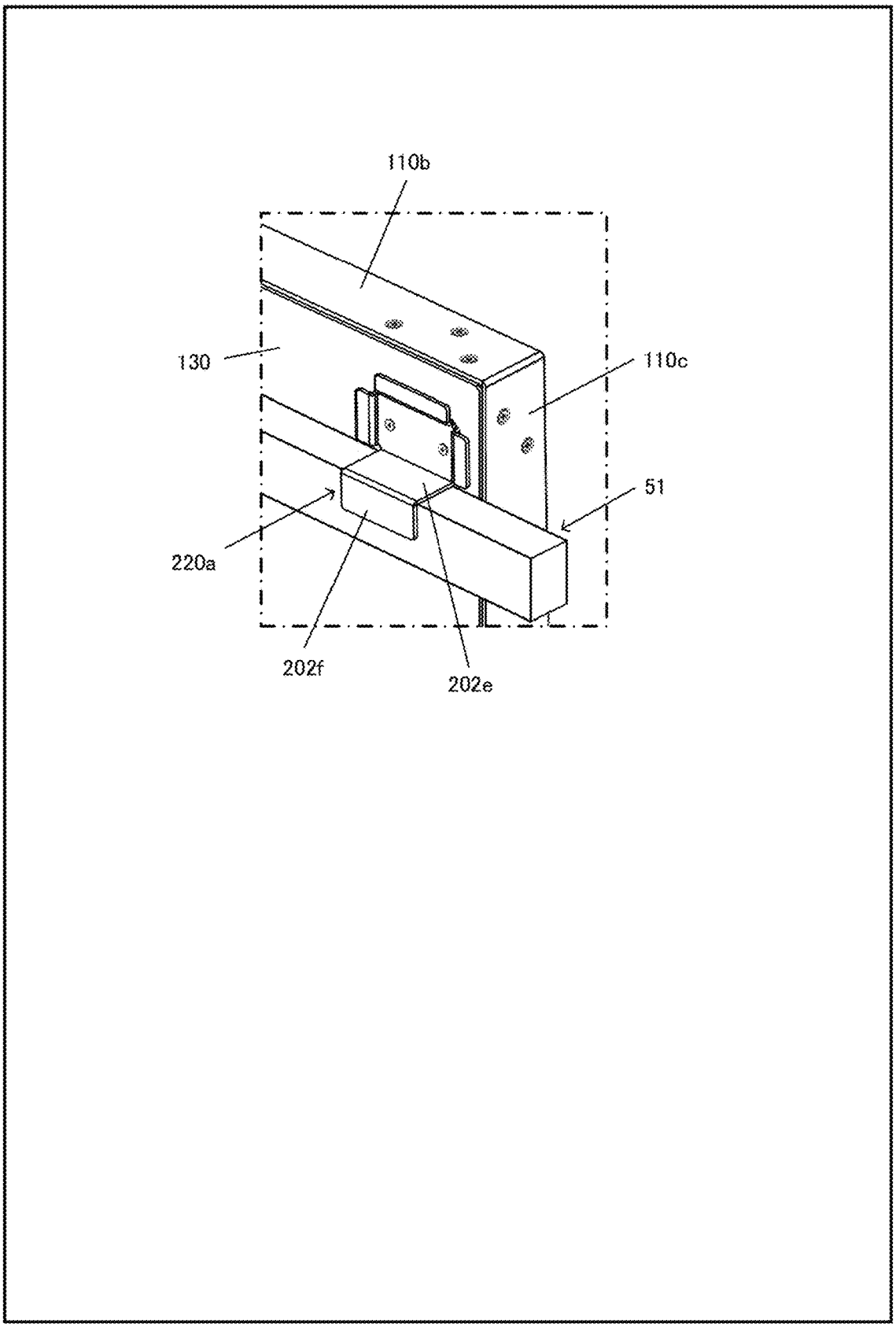
FIG. 23 is a perspective view illustrating an electronic board according to an embodiment of the present disclosure attached to a frame of a stand.

In use, as illustrated in FIG. 23, the electronic board 10 is attached to the frame 51 (an example of an attachment body of the present disclosure) of the stand 50 (see FIG. 2) and the like by the hook portion 202e and the fastening portion 202f of the board installation plate 220a. The board installation plate 220a attached to the frame 51 is screwed to the corner reinforcing plates 210a that firmly screws the bezel 110. As described above, the electronic board 10 is supported by the board installation plate 220a screwed to the corner reinforcing plates 210a disposed at the corners (four corners). Therefore, since the electronic board 10 can be reliably placed on the stand 50 in practical use, deformation due to its own weight and the like of the electronic board 10 hardly occurs.

What is claimed is:

1. An electronic board capable of detecting a contact position on a writing board, comprising:
   a sensor sheet including a plurality of first electrode wires extending in a first direction, and a plurality of second electrode wires extending in a second direction crossing the first direction; and
   a chassis that fixes the sensor sheet, wherein
   a first sensor substrate to which the plurality of first electrode wires are connected is connected to an end in the first direction of the sensor sheet, a second sensor substrate to which the plurality of second electrode wires are connected is connected to an end in the second direction of the sensor sheet, and
   at least one of the first sensor substrate and the second sensor substrate is disposed on a back surface of the chassis with a portion close to an end of the sensor sheet being bent to cover an end of the chassis, wherein
   the first sensor substrate is disposed on the back surface of the chassis with a portion close to the end in the first direction of the sensor sheet being bent to cover an end of the chassis in the first direction,
   the second sensor substrate is disposed on a side surface of the chassis with a portion close to an end in the second direction of the sensor sheet being bent at the end of the chassis in the second direction,
   a support member is disposed on a back side of the chassis for supporting the chassis; and
   a bezel that forms an outer frame of the electronic board, wherein
   the support member includes an upper surface, a side surface extending from the upper surface to the back surface of the chassis and being screwed to the bezel, and a chassis pressing portion contacting with the back surface of the chassis, and the first sensor substrate is further in contact with a buffer member disposed in a space formed between the upper surface of the support member and the back surface of the chassis, and is movably supported relative to the chassis.

2. The electronic board according to claim 1, wherein the second sensor substrate is further in contact with a buffer member disposed in a space formed between the side surface of the chassis and a side surface of the bezel, and is movably supported relative to the chassis.

3. The electronic board according to claim 1, further comprising:
- a back cover that covers a back side of the electronic board; and
- a mounting member for mounting the back cover to the electronic board, wherein
- the mounting member includes a lower surface that is placed in an opening formed in the back cover and is screwed to the upper surface of the support member, and a back cover pressing portion that supports the back cover, and
- the back cover is held between the upper surface of the support member and the back cover pressing portion.

4. The electronic board according to claim 1, further comprising:
- the writing board arranged such that contacting of a pen tip of a pen as a writing instrument onto the writing board remains as visible handwriting;
- a position detection section that detects the contact position on the writing board at which the pen tip contacts onto the writing board; and
- a pen identification section that detects an identification signal output from the pen.

* * * * *